(12) United States Patent
Yoshida et al.

(10) Patent No.: US 10,593,548 B2
(45) Date of Patent: Mar. 17, 2020

(54) COATING METHOD

(71) Applicant: SCREEN Holdings Co., Ltd., Kyoto (JP)

(72) Inventors: Shogo Yoshida, Kyoto (JP); Hiroyuki Ogura, Kyoto (JP); Ryuichi Yoshida, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/956,843

(22) Filed: Apr. 19, 2018

(65) Prior Publication Data

US 2018/0308678 A1    Oct. 25, 2018

(30) Foreign Application Priority Data

Apr. 24, 2017  (JP) ................. 2017-085142

(51) Int. Cl.
| | | |
|---|---|---|
| *H01L 21/02* | (2006.01) | |
| *H01L 21/027* | (2006.01) | |
| *G03F 7/16* | (2006.01) | |
| *G03F 7/38* | (2006.01) | |
| *H01L 21/67* | (2006.01) | |

(52) U.S. Cl.
CPC ............. *H01L 21/027* (2013.01); *G03F 7/16* (2013.01); *G03F 7/162* (2013.01); *G03F 7/38* (2013.01); *H01L 21/02282* (2013.01); *H01L 21/6715* (2013.01)

(58) Field of Classification Search
CPC combination set(s) only.
See application file for complete search history.

(56) References Cited

U.S. PATENT DOCUMENTS

| | | | | |
|---|---|---|---|---|
| 10,312,114 | B2* | 6/2019 | Yoshizumi | ........ H01L 21/67028 |
| 2012/0322273 | A1* | 12/2012 | Oori | ................. H01L 21/02282 |
| | | | | 438/765 |
| 2016/0209748 | A1 | 7/2016 | Hasimoto et al. | |
| 2016/0247698 | A1 | 8/2016 | Yoshizumi et al. | |

(Continued)

FOREIGN PATENT DOCUMENTS

| | | |
|---|---|---|
| JP | 2002-175966 A | 6/2002 |
| JP | 2009-253028 A | 10/2009 |
| JP | 2010-114328 A | 5/2010 |

(Continued)

OTHER PUBLICATIONS

Office Action dated Mar. 4, 2019 for Taiwan Patent Application No. 107113486.

(Continued)

*Primary Examiner* — Moin M Rahman
(74) *Attorney, Agent, or Firm* — Ostrolenk Faber LLP

(57) ABSTRACT

A coating method of coating a substrate with a chemical includes a solvent supplying step and a chemical supplying step. In the solvent supplying step, a solvent is supplied to the substrate. After the solvent supplying step, the chemical is supplied to the substrate in the chemical supplying step. The solvent supplying step includes a first step. The first step causes the substrate to rotate at a first rotation speed, causes a solvent nozzle to move between a central position above a center portion of the substrate and a peripheral position above a peripheral portion of the substrate, and causes the solvent nozzle to dispense the solvent.

17 Claims, 16 Drawing Sheets

(56) References Cited

U.S. PATENT DOCUMENTS

2018/0021804 A1    1/2018   Hashimoto et al.

FOREIGN PATENT DOCUMENTS

| | | |
|---|---|---|
| JP | 2014-093371 A | 5/2014 |
| JP | 2016-134393 A | 7/2016 |
| KR | 10-2016-0067216 A | 6/2016 |
| TW | I552192 | 10/2016 |
| TW | 201701082 A | 1/2017 |

OTHER PUBLICATIONS

Office Action dated Oct. 8., 2019 for Korean Patent Application No. 10-2018-0046845.

\* cited by examiner

COATING METHOD

CROSS-REFERENCE TO RELATED APPLICATIONS

This application claims priority to Japanese Patent Application No. 2017-085142 filed Apr. 24, 2017, the disclosure of which is hereby incorporated herein by reference in its entirety for all purposes.

TECHNICAL FIELD

The present invention relates to a coating method of coating a substrate with a chemical. Examples of substrates include a semiconductor wafer, a glass substrate for photomask, a glass substrate for liquid crystal display, a substrate for plasma display, a substrate for organic electroluminescence (EL), a substrate for field emission display (FED), a substrate for optical display, a magnetic disk substrate, an optical disk substrate, an optical magnetic disk substrate, and a solar cell substrate.

BACKGROUND ART

Japanese Unexamined Patent Publication No. 2002-175966A discloses a coating method of forming a resist film on a substrate. The coating method includes a solvent supplying step and a chemical supplying step. In the solvent supplying step, a solvent is dropped to the substrate. More specifically, in the solvent supplying step, the solvent is dropped to a center portion of the substrate at rest. In the solvent supplying step, after the solvent is dropped, the solvent is scattered by rotation of the substrate. In the chemical supplying step, the substrate is rotated while a chemical (specifically, a resist film material) is dropped onto the substrate. In the chemical supplying step, after the chemical is dropped, the chemical is scattered by rotation of the substrate.

As noted above, the coating method includes the solvent supplying step. Accordingly, the chemical supplying step allows the chemical to spread concentrically. In other words, the chemical supplying step allows prevention of the chemical from spreading toward a part of a peripheral portion of the substrate in an elongated manner. Consequently, air bubbles between the substrate and the chemical are avoidable.

SUMMARY OF INVENTION

Technical Problem

However, the currently-used apparatus having such a configuration as above possesses the following disadvantages. The currently-used coating method sometimes has difficulty in coating the substrate with the chemical appropriately. For instance, the chemical may fail to be applied to a part of the substrate. Such a phenomenon is called as "film tear" or "uncoating". In addition, a coating film of the chemical formed on the substrate may have an uneven film thickness.

It makes more difficult to coat the substrate with the chemical especially when the substrate has depressions formed on its top face. For instance, there may be the case where the chemical enters into some depressions only, and thus not enter into the other depressions.

The present invention has been made regarding the state of the art noted above, and its one object is to provide a coating method that allows appropriate coating of a substrate with a chemical.

Solution to Problem

The present invention is constituted as stated below to achieve the above object. One aspect of the present invention provides a coating method of coating a substrate with a chemical. The coating method includes a solvent supplying step of supplying a solvent to the substrate, and a chemical supplying step of supplying the chemical to the substrate after the solvent supplying step. The solvent supplying step includes a first step of rotating the substrate at a first rotation speed, moving a solvent nozzle between a central position above a center portion of the substrate and a peripheral position above a peripheral portion of the substrate, and dispensing the solvent from the solvent nozzle.

In the first step, the substrate is rotated, and the solvent nozzle is moved between the central position and the peripheral position while dispensing the solvent. When the solvent nozzle is located at the central position, the solvent nozzle drops the solvent to the center portion of the substrate. When the solvent nozzle is located at the peripheral position, the solvent nozzle drops the solvent to the peripheral portion of the substrate. As noted above, the first step supplies the solvent to both the center portion and the peripheral portion of the substrate in a similar manner. Consequently, the first step allows the solvent to be supplied to the entire substrate uniformly.

The chemical supplying step is performed after the solvent supplying step. Since the solvent is applied to the entire substrate uniformly, the chemical supplying step allows the chemical to be supplied to the substrate appropriately. As noted above, the present coating method achieves suitable coating of the substrate with the chemical.

It is preferred in the aspect of the coating method that the first rotation speed is more than 0 rpm and less than 500 rpm, the solvent nozzle includes an outlet through which the solvent is dispensed, and a number of rotations of the substrate for a period of time when the solvent nozzle is moved between the central position and the peripheral position in the first step is equal to or more than a reference value obtained by dividing a radius of the substrate by a dimension of the outlet.

The first rotation speed is relatively low. Accordingly, even if the substrate has some depressions, the solvent easily enters into the depressions. The solvent enters into the depressions, whereby the chemical enters into the depressions smoothly in the chemical supplying step.

Moreover, the number of rotations of the substrate for a period of time during movement of the solvent nozzle between the central position and the peripheral position in the first step is equal to or more than the reference value. In other words, the substrate rotates the number of times equal to or more than the reference value for a period of time during the movement of the solvent nozzle between the central position and the peripheral position in the first step. This causes the solvent to be dropped to the most portion of the substrate. Consequently, the solvent is able to be supplied to the entire substrate more uniformly in the first step.

It is preferred in the aspect of the coating method that the period of time when the solvent nozzle moves between the central position and the peripheral position in the first step is equal to or longer than a first reference time obtained by dividing the reference value by the first rotation speed. In other words, it is preferred in the aspect of the coating method that the solvent nozzle is moved between the central position and the peripheral position for a period of time equal to or longer than the first reference time in the first step. This causes the solvent to be dropped to the most portion of the substrate uniformly. Consequently, the solvent is able to be supplied to the entire substrate more uniformly in the first step.

It is preferred in the aspect of the coating method that the solvent supplying step includes a puddle-forming step of keeping a puddle of the solvent on the substrate. The puddle-forming step causes the solvent to be wettable with the substrate suitably. Accordingly, even if the substrate has some depressions, the solvent enters into the depressions more easily.

It is preferred in the aspect of the coating method that the solvent supplying step includes a second step of rotating the substrate at a second rotation speed, moving the solvent nozzle between the central position and the peripheral position, and dispensing the solvent from the solvent nozzle. Here, the second step is similar to the first step. That is, the second step causes the substrate to rotate, and causes the solvent nozzle to move between the central position and the peripheral position while dispensing the solvent. Consequently, the solvent is able to be supplied to the entire substrate uniformly in the second step. Since the solvent supplying step includes the second step in addition to the first step, the solvent is able to be supplied to the entire substrate more uniformly.

It is preferred in the aspect of the coating method that the second rotation speed is more than 0 rpm and less than 500 rpm. The second rotation speed is relatively low. Accordingly, even if the substrate has some depressions, the solvent easily enters into the depressions. The solvent enters into the depressions, whereby the chemical enters into the depressions smoothly in the chemical supplying step.

It is preferred in the aspect of the coating method mentioned above that the solvent supplying step includes a film-thinning step of thinning a film of the solvent formed on the substrate by rotating the substrate. The solvent supplying step includes the film-thinning step. Accordingly, the chemical supplying step causes the chemical to be supplied to the film of the solvent whose thickness is relatively small. This results in suitable prevention of variation in thickness of a chemical coating film.

It is preferred in the aspect of the coating method that the first rotation speed is more than 500 rpm. The first rotation speed is relatively high. Accordingly, even if the substrate has some depressions, the solvent is unlikely to enter into the depressions. Consequently, even if the substrate has some depressions, the depressions are not filled with the solvent, but upper portions of the depressions are covered with the solvent. Hereunder, covering the upper portions of the depressions with the solvent without filling the depressions with the solvent is referred to as "tenting the depressions with the solvent". Since the depressions are tented with the solvent, the upper portions of the depressions are coverable with the chemical without being filled with the chemical. Hereunder, covering the upper portions of the depressions with the chemical without filling the depressions with the chemical is referred to as "tenting the depressions with the chemical".

It is preferred in the aspect of the coating method that the solvent nozzle includes an outlet thorough which the solvent is dispensed, and that a number of rotations of the substrate for a period of time when the solvent nozzle moves between the central position and the peripheral position in the first step is within a range in plus or minus 20% of a reference value obtained by dividing a radius of the substrate by a dimension of the outlet. In other words, it is preferred in the coating method that the substrates rotates the number of rotations within a range in plus or minus 20% of the reference value for a period of time during movement of the solvent nozzle between the central position and the peripheral position in the first step. This causes the solvent to be dropped to the most portion of the substrate. Consequently, the solvent is able to be supplied to the entire substrate more uniformly in the first step.

It is preferred in the coating method mentioned above that the period of time when the solvent nozzle moves between the central position and the peripheral position in the first step is within a range in plus or minus 20% of a first reference time obtained by dividing the reference value by the first rotation speed. In other words, it is preferred in the coating method that the solvent nozzle moves between the central position and the peripheral position for the period of time within a range in plus or minus 20% of the first reference time in the first step. This causes the solvent to be dropped to the most portion of the substrate uniformly. Consequently, the solvent is able to be supplied to the entire substrate more uniformly in the first step.

It is preferred in the aspect of the coating method mentioned above that the solvent supplying step includes a film-thinning step of thinning a film of the solvent formed on the substrate by rotating the substrate. The solvent supplying step includes the film-thinning step. Accordingly, the chemical supplying step causes the chemical to be supplied to the film of the solvent whose thickness is relatively small. This results in suitable prevention of variation in thickness of a chemical coating film.

It is preferred in the aspect of the coating method mentioned above that the solvent supplying step performs only the first step and the film-thinning step. This achieves reduction in time for the solvent supplying step. This also achieves reduction in amount of the solvent for use in the solvent supplying step. Accordingly, even if the substrate has some depressions, the depressions are able to be tented with the solvent more suitably. As a result, the depressions are able to be tented with the chemical more suitably in the chemical supplying step.

It is preferred in the aspect of the coating method mentioned above that the chemical supplied to the substrate in the chemical supplying step has viscosity of 200 cP or more. The chemical has relatively high viscosity. Accordingly, if the substrate has some depressions, the chemical is unlikely to enter into the depressions. Consequently, even if the substrate has some depressions, the depressions are able to be tented with the chemical more suitably.

It is preferred in the aspect of the coating method mentioned above that the solvent nozzle moves from the central position to the peripheral position in the first step. The solvent nozzle dispenses the solvent at the central position before dispensing at the peripheral position. The solvent nozzle allows smooth supply of the solvent to the substrate at the central position. Additionally, the solvent nozzle moves from the central position to the peripheral position. Accordingly, this allows smooth supply of the solvent from the center portion to the peripheral portion of the substrate.

It is preferred in the aspect of the coating method that the solvent dispensed from the solvent nozzle flows down in a rod shape. The solvent nozzle achieves suitable dropping of the solvent onto the substrate.

It is preferred in the aspect of the coating method mentioned above that the substrate is circular in plan view. In other words, it is preferred in the aspect of the coating method mentioned above that the substrate is a circular substrate. The solvent supplying step allows the solvent to be supplied to the entire substrate more uniformly. Likewise, the chemical supplying step allows the chemical to be supplied to the entire substrate more uniformly.

It is preferred in the aspect of the coating method mentioned above that the substrate has depressions formed on a top face thereof. The solvent supplying step of the present coating method allows the solvent to be supplied to the entire substrate uniformly even when the substrate has the depressions. This results in suitable supply of the chemical to the substrate in the chemical supplying step. As noted above, the present coating method possesses high utility especially when the substrate includes the depressions.

Here, the term "depression" is, for example, a part of patterns formed on the top face of the substrate.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

EMBODIMENT 1

The following describes Embodiment 1 of the present invention with reference to drawings.

1. Outline of Substrate Treating Apparatus 1

Figure 1:
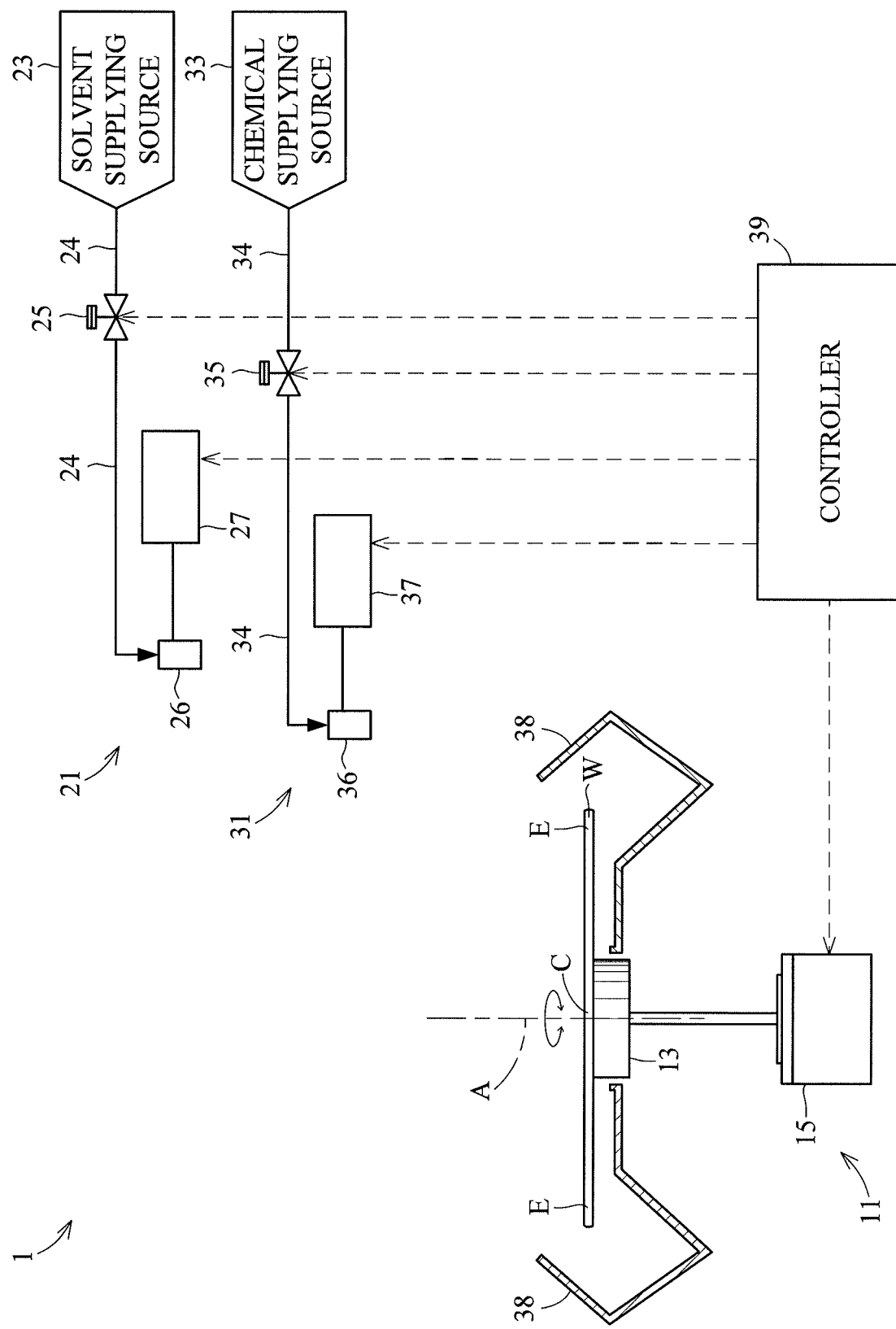
FIG. 1 schematically illustrates a substrate treating apparatus according to Embodiment 1 of the present invention.

FIG. 1 schematically illustrates a substrate treating apparatus according to Embodiment 1. A substrate treating apparatus 1 coats a substrate (e.g., semiconductor wafer) W with a chemical.

The substrate treating apparatus 1 includes a spin holder 11 that holds the substrate W rotatably. The spin holder 11 includes a spin chuck 13 and a drive unit 15. The spin chuck 13 holds the substrate W in a substantially horizontal attitude. The spin chuck 13 suction-holds a center portion of a back side of the substrate W, thereby holding the substrate W. The spin chuck 13 has a lower part connected to a drive unit 15. The drive unit 15 causes the spin chuck 13 and the substrate W to rotate integrally. The substrate W is rotated around a rotation center axis A. The rotation center axis A is substantially parallel to a vertical direction. The substrate W includes a central portion C and a peripheral portion E. The rotation center axis A passes the center portion C of the substrate W. The drive unit 15 is, for example, a motor.

The substrate treating apparatus 1 includes a solvent supplying unit 21 that supplies a solvent to the substrate W. The solvent supplying unit 21 includes a solvent supplying source 23, a pipe 24, an on-off valve 25, a solvent nozzle 26, and a moving mechanism 27. The solvent supplying source 23 stores the solvent. The pipe 24 has a first end that is in communication with the solvent supplying source 23. The pipe 24 has a second end that is in communication with the solvent nozzle 26. The on-off valve 25 is disposed on the pipe 24. The on-off valve 25 opens/closes a flow path of the solvent in the pipe 24. The solvent nozzle 26 dispenses the solvent. The moving mechanism 27 moves the solvent nozzle 26.

The solvent is, for example, an organic solvent. Examples of the solvent include thinner, propylene glycol monomethyl ether acetate (PGMEA), emulsifying ethyl, and isopropyl alcohol (IPA).

The substrate treating apparatus 1 includes a chemical supplying unit 31 that supplies a chemical (i.e., a chemical liquid) to the substrate W. The chemical supplying unit 31 includes a chemical supplying source 33, a pipe 34, an on-off valve 35, a chemical nozzle 36, and a moving mechanism 37. The chemical supplying source 33 stores the chemical. The pipe 34 has a first end that is in communication with the chemical supplying source 33. The pipe 34 has a second end that is in communication with the chemical nozzle 36. The on-off valve 35 is disposed on the pipe 34. The on-off valve 35 opens/closes a flow path of the chemical in the pipe 34. The chemical nozzle 36 dispenses the chemical. The moving mechanism 37 moves the chemical nozzle 36.

The chemical is a coating liquid, for example, that forms a coating film on the substrate W. The coating film is, for example, a resist film, a protective film, an insulating film, a spin-on-glass (SOG) film, or a spin-on-dielectric (SOD) film. Here, the insulating film includes an interlayer insulating film. The coating liquid includes, for example, polyimide resin. The coating liquid is, for example, a resist film material, a protective film material, an insulating film material, a spin-on-glass (SOG) film material, or a spin-on-dielectric (SOD) film material.

The substrate treating apparatus 1 includes a scatter preventive cup 38. The scatter preventive cup 38 surrounds the spin chuck 13. The scatter preventive cup 38 receives and collects the treating liquids (i.e., the chemical, the solvent, and the like) scattering from the substrate W.

The substrate treating apparatus 1 further includes a controller 39. The controller 39 controls en bloc each element of the apparatus mentioned above. Specifically, the controller 39 controls the drive unit 15 to adjust a rotation speed (e.g., revolutions per minute (rpm)) of the substrate W. The controller 39 controls the moving mechanisms 27 and 37 to move the solvent nozzle 26 and the chemical nozzle 36, respectively. The controller 39 controls the on-off valves 25 and 35 to switch between supply and stop of the supply of the solvent and the chemical, respectively.

The controller 39 contains treatment recipes and the like with pre-set treatment conditions for treating the substrate W. Here, examples of the treatment condition include information on the rotation speed of the substrate W, a position of the solvent nozzle 26, a supply amount of the solvent, a position of the chemical nozzle 36, and a supply amount of the chemical. The controller 39 is implemented by a central processing unit (CPU) that performs various processes, a RAM (Random-Access Memory) as a workspace of arithmetic processing, and a storage medium such as a fixed disk that stores various types of information.

2. Solvent Nozzle 26 and its Associated Configuration

Figure 2:
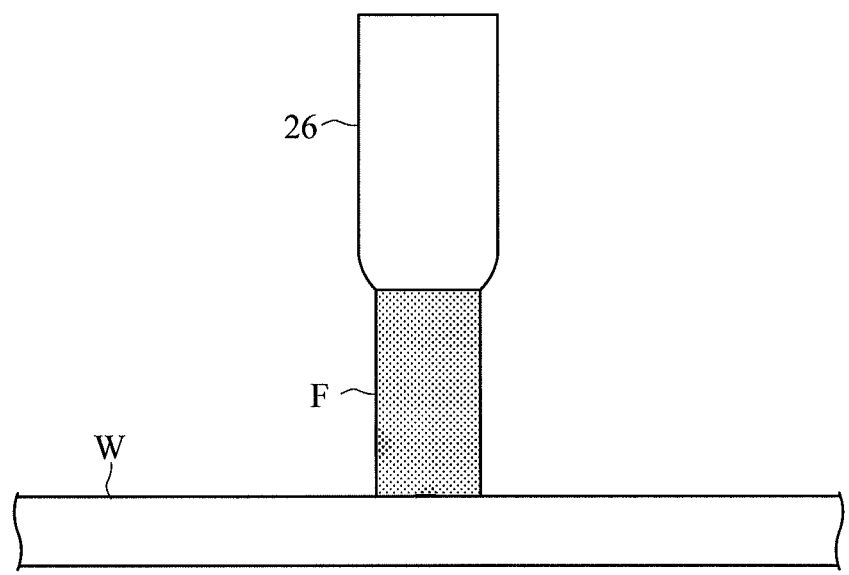
FIG. 2 is a side view of a solvent nozzle.

FIG. 2 is a side view of the solvent nozzle 26. The solvent nozzle 26 is, for example, a straight nozzle. The solvent nozzle 26 dispenses solvent F from a lower face of the solvent nozzle 26. The solvent nozzle 26 dispenses the solvent F downwardly.

Figure 3:
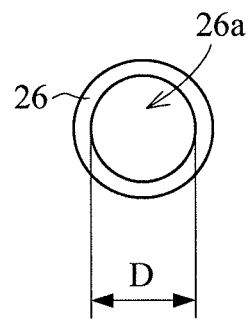
FIG. 3 is a bottom view of the solvent nozzle.

FIG. 3 is a bottom view of the solvent nozzle 26. The solvent nozzle 26 has an outlet 26a through which the solvent F is dispensed. The outlet 26a is formed in the lower face of the solvent nozzle 26. The outlet 26a is substantially circular. The outlet 26a has a dimension D. The dimension D is, for example, a diameter of the outlet 26a.

Figure 4:
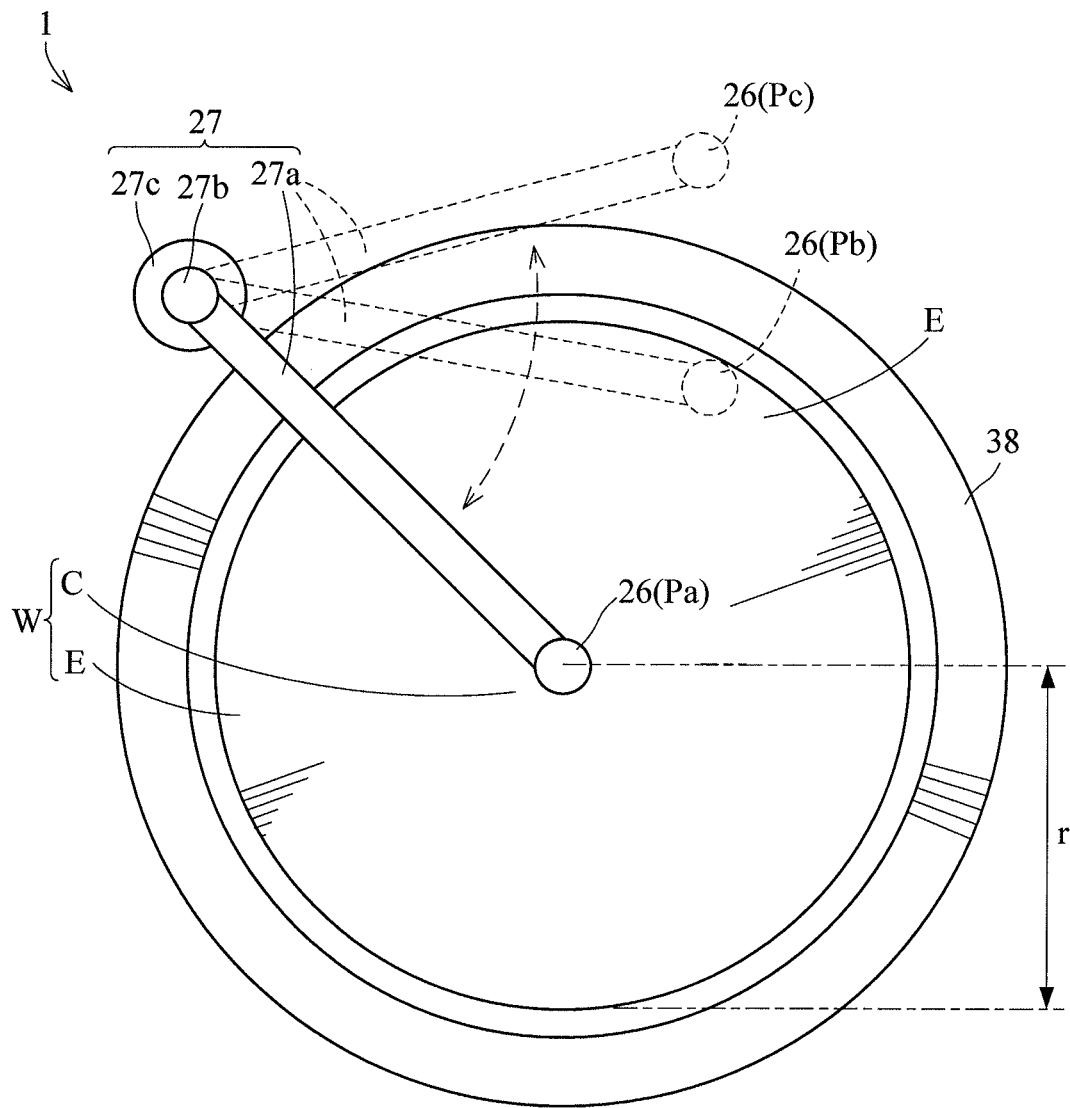
FIG. 4 is a plan view of the substrate treating apparatus according to Embodiment 1.

FIG. 4 is a plan view of the substrate treating apparatus 1. FIG. 4 omits illustration of the moving mechanism 37.

The substrate W is circular in plan view. The substrate W is a circular substrate. The substrate W has a radius r.

The moving mechanism 27 includes an arm 27a, a shaft 27b, and a drive unit 27c. The arm 27a extends substantially horizontal. The arm 27a has a distal end for holding the solvent nozzle 26. The solvent nozzle 26 is disposed higher in level than the substrate W held by the spin holder 11. The arm 27a has a proximal end connected to the shaft 27b. The shaft 27b supports the arm 27a. The shaft 27a extends substantially vertically. The shaft 27b is disposed outwardly of the scatter preventive cup 38. The drive unit 27c is coupled to the shaft 27b. The drive unit 27c causes the shaft 27b to rotate. The rotation of the shaft 27b causes the solvent nozzle 26 to pivot around the shaft 27b.

The moving mechanism 27 moves the solvent nozzle 26 to a central position Pa, a peripheral position Pb, and a retracting position Pc. Here, the central position Pa overlaps the center portion C of the substrate W in plan view. The peripheral position Pb overlaps the peripheral portion E of the substrate W in plan view. The retracting position Pc does not overlap the substrate W in plan view.

Figure 5:
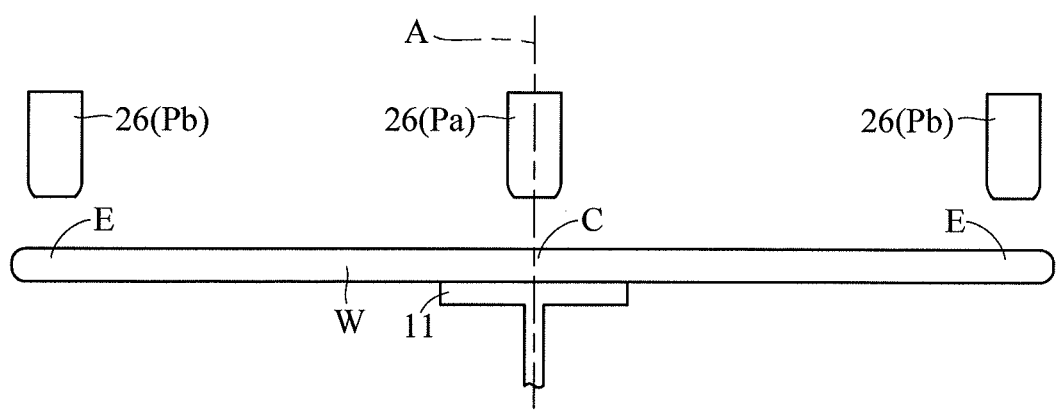
FIG. 5 is a side view illustrating positions of the solvent nozzle.

FIG. 5 is a side view illustrating positions of the solvent nozzle 26. Here, the central position Pa is above the center portion C of the substrate W. When located at the central position Pa, the solvent nozzle 26 is positioned on a rotation center A. The peripheral position Pb is positioned above the peripheral portion E of the substrate W.

The moving mechanism 37 moves the chemical nozzle 36 between the central position Pa and the retracting position Pc, which illustration is omitted. The central position Pa of the chemical nozzle 36 may be equal to or different from the central position Pa of the solvent nozzle 26. The same is applicable to the retracting position Pc of the chemical nozzle 36.

3. Coating Method of Embodiment 1

Figure 6A:
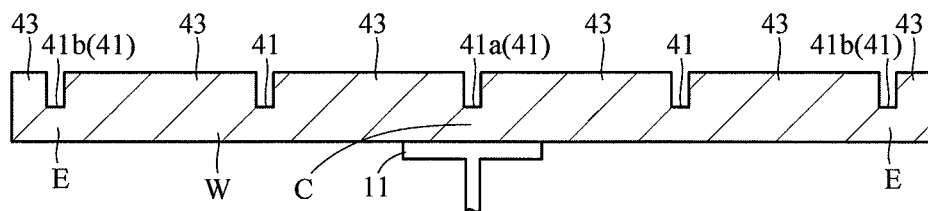
FIGS. 6A to 6F each schematically illustrate a solvent supplying process according to Embodiment 1.

FIG. 6A schematically illustrates a substrate W to which a coating method is performed. Firstly, exemplified is a substrate W to which the coating method is performed.

The coating method is performed to the substrate W held by the spin holder 11 substantially horizontally. Here, a top face of the substrate W is substantially horizontal. However, the top face of the substrate W is not planar. The top face of the substrate W has steps.

Specifically, the substrate W includes depressions 41 and projections 43. The depressions 41 and the projections 43 are formed on the top face of the substrate W. The depressions 41 are dented downwardly. The projections 43 project upwardly.

The depressions 41 include depressions 41a and depressions 41b. The depressions 41a are located at the center portion C of the substrate W. The depressions 41a are located at the peripheral portion E of the substrate W.

The depressions 41 and the projections 43 are, for example, a part of patterns formed on the top face of the substrate W. In other words, the substrate W has the patterns formed on its top face. The depressions 41 are, for example, spaces, holes, or trenches. Here, the hole includes a via hole, a through hole, a contact hole, and the like. The projection 43 is, for example, a line, dot, or a sidewall.

Figure 7:
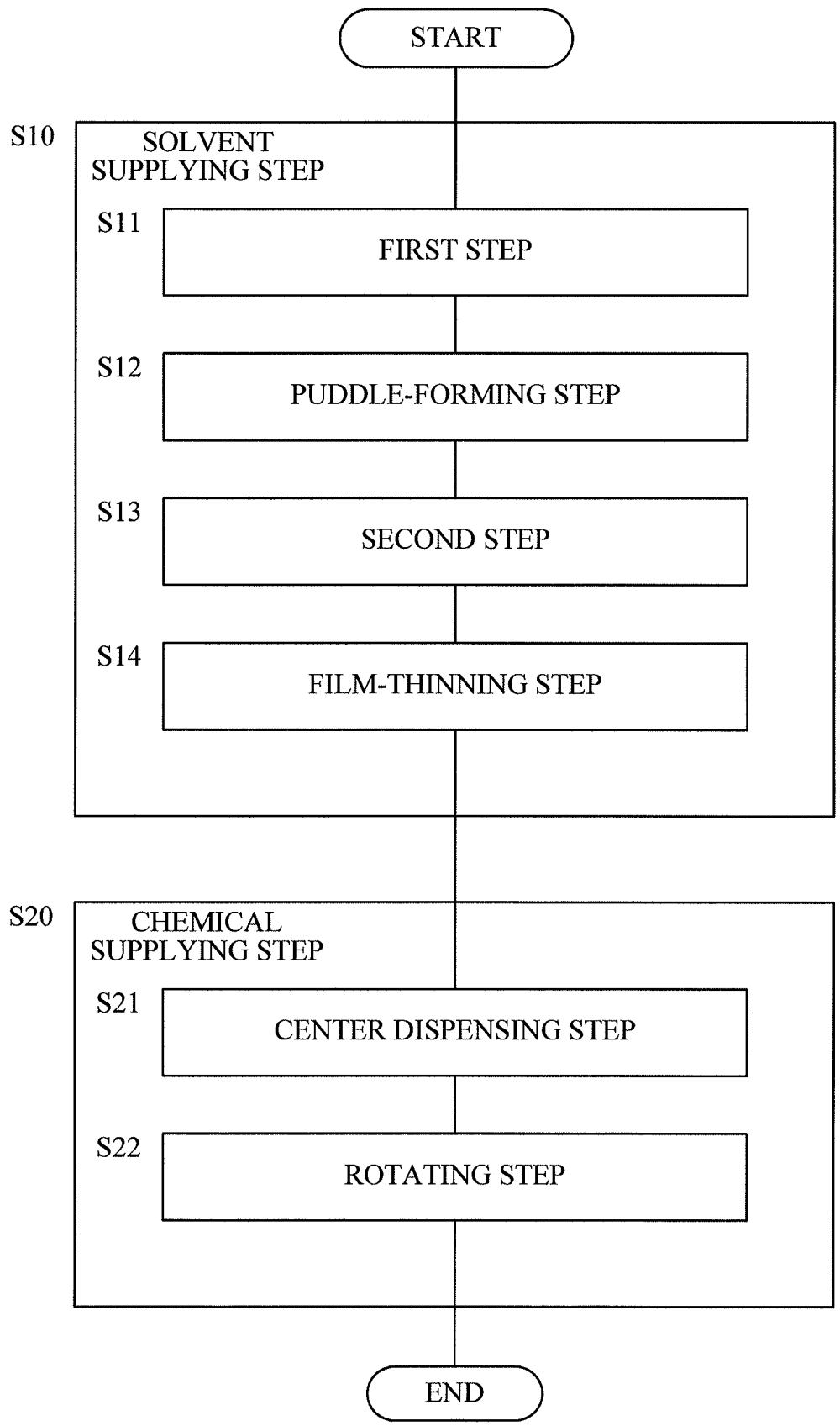
FIG. 7 is a flow chart of procedures in a coating method according to Embodiment 1.

FIG. 7 is a flow chart of procedures in the coating method according to Embodiment 1. Here, exemplified is the coating method performed by the substrate treating apparatus 1.

The coating method includes a solvent supplying step (Step S10) and a chemical supplying step (Step S20). In the solvent supplying step, the solvent F is supplied to the substrate W. Here, the solvent supplying step is also referred to as "pre-wet". The chemical supplying step is performed after the solvent supplying step. In the chemical supplying step, the chemical is supplied to the substrate W.

The solvent supplying step includes a first step (Step S11), a puddle-forming step (Step S12), a second step (Step S13), and a film-thinning step (Step S14). The chemical supplying step includes a center dispensing step (Step S21) and a rotating step (Step S22).

Now each of the steps is to be described. In the following description, it is assumed that each element operates under control by the controller 39.

<Step S11> First Step

Figure 8:
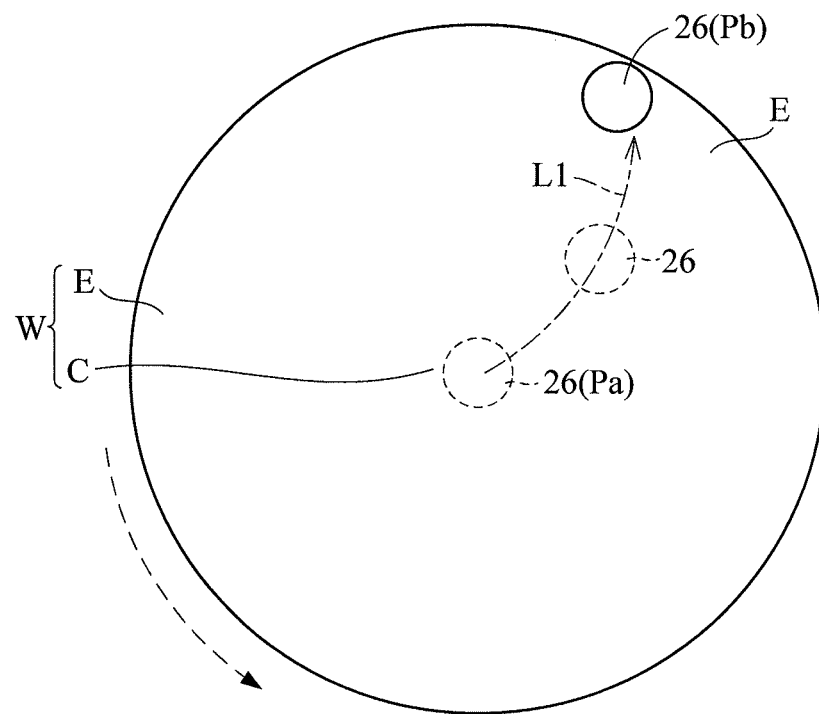
FIG. 8 is a plan view illustrating operation of a first step.

FIG. 8 is a plan view illustrating operation of the first step. The first step causes the substrate W to rotate at a first rotation speed R1, causes the solvent nozzle 26 to move between the central position Pa and the peripheral position Pb, and causes the solvent nozzle 26 to dispense the solvent F. More specifically, the first step causes the solvent nozzle 26 to move from the central position Pa to the peripheral position Pb. FIG. 8 illustrates a route L1 where the solvent nozzle 26 moves. The route L1 is a curve closely similar to a radial direction of the substrate W in plan view. In the first step, movement of the solvent nozzle 26 from the central position Pa to the peripheral position Pb is performed once. The first step causes the solvent nozzle 26 to dispense the solvent F during the movement of the solvent nozzle 26 from the central position Pa to the peripheral position Pb.

Figure 6B:
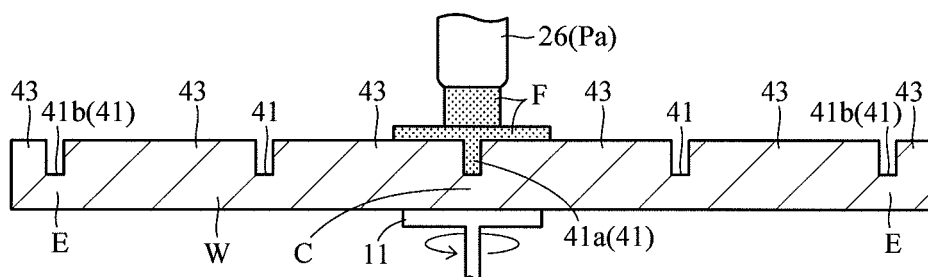
Figure 6C:
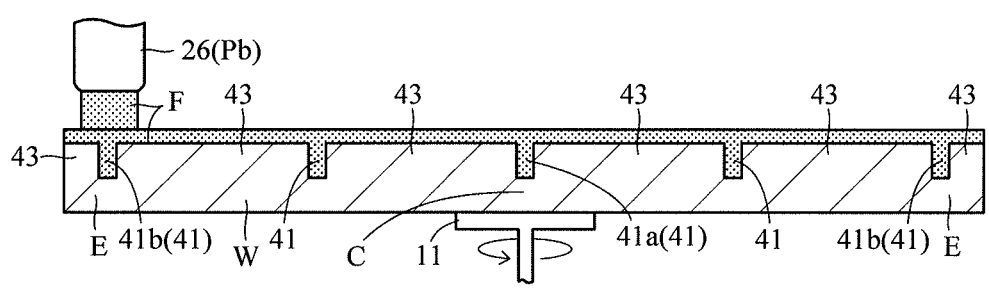

FIGS. 6B and 6C each schematically illustrate the first step. The solvent F drops down from the solvent nozzle 26 vertically. The dropping solvent F has a rod or column shape. That is, the solvent F dispensed from the solvent nozzle 26 flows down in a rod or column shape. A liquid column of the solvent F is formed between the solvent nozzle 26 and the substrate W. The liquid column of the solvent F extends substantially vertically.

The solvent F falls down to the top face of the substrate W. That is, the solvent F contacts the top face of the substrate W. The solvent F drops down to the top face of the substrate W substantially perpendicularly. After dropping down to the substrate W, the solvent F spreads over the top face of the substrate W substantially horizontally.

The first rotation speed R1 is relatively low. Specifically, it is preferred that the first rotation speed R1 is higher than 0 rpm and lower than 500 rpm. It is more preferred that the first rotation speed R1 is higher than 0 rpm and equal to or lower than 300 rpm. It is much more preferred that the first rotation speed R1 is equal to or higher than 100 rpm and equal to or lower than 200 rpm.

It is preferred that the first rotation speed R1 is constant. It is preferred that a moving speed of the solvent nozzle 26 in the first step is constant.

Reference is made to FIG. 6B. When the solvent nozzle 26 is located at the central position Pa, the solvent F dispensed from the solvent nozzle 26 drops to the depressions 41a. The solvent F drops down from directly above the depressions 41a to the depressions 41a. The first rotation speed R1 is relatively low, and thus the solvent F enters into the depressions 41a. The depressions 41a are filled with the solvent F.

Reference is made to FIG. 6C. When the solvent nozzle 26 is located at the peripheral position Pb, the solvent F dispensed from the solvent nozzle 26 drops to the depressions 41b. The solvent F drops down from directly above the depressions 41b to the depressions 41b. The first rotation speed R1 is relatively low, and thus the solvent F enters into the depressions 41b. The depressions 41b are filled with the solvent F.

In addition, a film of the solvent F is formed on the top face of the substrate W. The film of the solvent F lies over the top face of the substrate W. The film of the solvent F covers the entire top face of the substrate W.

Now a value obtained by dividing the radius r of the substrate W by a dimension D of the outlet 26a is referred to as a reference value N. See Mathematical Expression (1).

$$N=r/D \tag{1}$$

A value obtained by dividing the reference value N by the first rotation speed R1 is referred to as a first reference time T1. See Mathematical Expression (2).

$$T1=N/R1 \tag{2}$$

A number of rotations of the substrate W in a period of time when the solvent nozzle 26 moves from the central position Pa to the peripheral edge position Pb is equal to or more than the reference value N. In other words, the substrate W rotates a number of times equal to or more than the reference value N during the movement of the solvent nozzle 26 from the central position Pa to the peripheral position Pb. The period of time when the solvent nozzle 26 moves from the central position Pa to the peripheral position Pb is equal to or more than the first reference time T1. In other words, the solvent nozzle 26 moves from the central position Pa to the peripheral position Pb for a period of time equal to or more than the first reference time T1.

It is assumed, for example, that the radius r of the substrate W is 150 mm, the dimension D of the outlet 26a is 3 mm, and the first rotation speed R1 is 150 rpm. In this case, the reference value N is 50, and the first reference time T1 is 20 sec. (i.e., ⅓ min.). In other words, the substrate W rotates by 50 or more rounds during the movement of the solvent nozzle 26 from the central position Pa to the peripheral position Pb. The solvent nozzle 26 moves from the central position Pa to the peripheral position Pb for 20 sec. or more.

Figure 9:
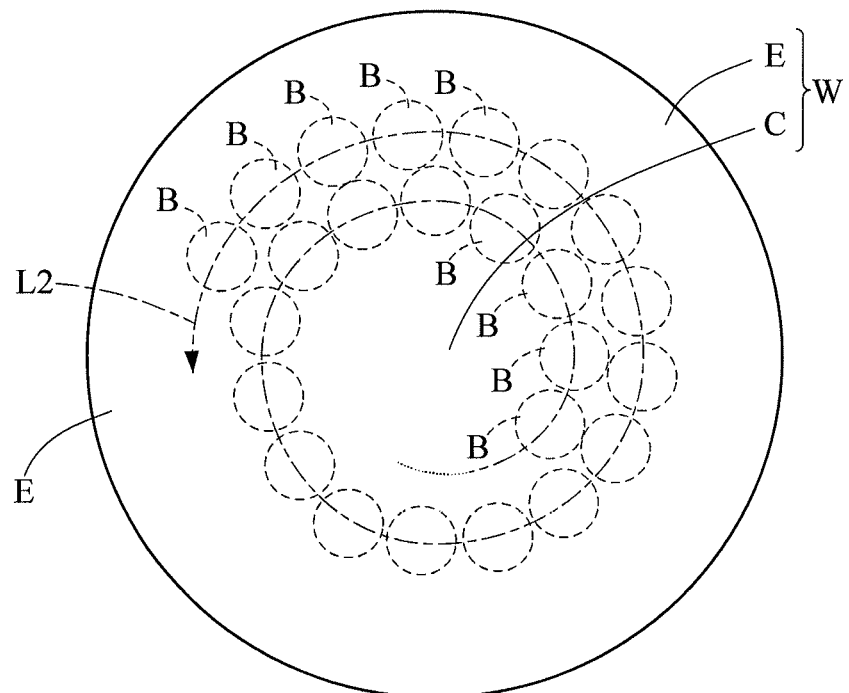
FIG. 9 is a plan view schematically illustrating a drop area.

FIG. 9 is a plan view schematically illustrating a drop area B. The drop area B is an area of the substrate W where the solvent F drops down. The drop area B at one time is substantially equal in size to the outlet 26a. The drop area B at one time is substantially equal in position to the outlet 26a in plan view.

The solvent nozzle 26 moves from the central position Pa to the peripheral position Pb, whereby the drop area B is shifted from the center portion C to the peripheral portion E. The solvent nozzle 26 moves and the substrate W rotates, whereby the drop area B is shifted in a spiral (helical) manner in plan view. FIG. 9 illustrates a locus L2 of the drop area B.

The substrate W rotates the number of times equal to or more than the reference value N for a period of time when the solvent nozzle 26 moves from the central position Pa to the peripheral position Pb. The solvent nozzle 26 moves from the central position Pa to the peripheral position Pb in a period of time equal to or more than the first reference time T1. This causes the drop area B to occupy the most portion of the top face of the substrate W. That is, the solvent F drops onto the most portion of the substrate W.

As noted above, the solvent F drops onto both the center portion C and the peripheral portion E in the first step. That is, the solvent F drops onto the most portion of the substrate W. Consequently, the solvent F is supplied to the entire substrate W uniformly. The solvent F enters into the depressions 41.

<Step S12> Puddle-Forming Step

Figure 6D:
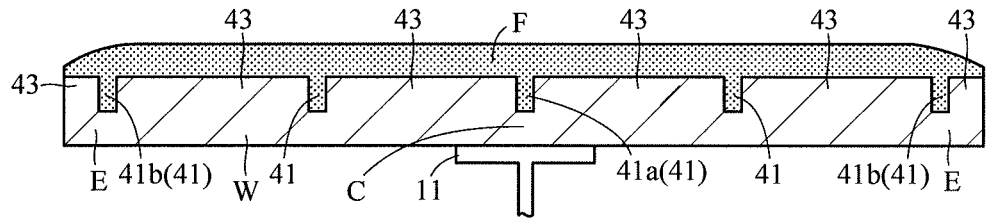

FIG. 6D schematically illustrates the puddle-forming step. The puddle-forming step is performed after the first step. In the puddle-forming step, a puddle of the solvent F is kept on the substrate W. The puddle-forming step causes the rotation speed of the substrate W to decrease from the first rotation speed R1, and causes the solvent nozzle 26 to stop dispense of the solvent F. It is preferred that the rotation speed of the substrate W in the puddle-forming step is equal to more than 0 rpm and equal to or less than 10 rpm. For instance, in the puddle-forming step, the substrate W may be at rest. For instance, the puddle-forming step may cause the solvent nozzle 26 to be at rest at the peripheral position Pb. This achieves rapid start of the second step after the puddle-forming step. It is preferred that a period of time of the puddle-forming step is, for example, 5 sec. or more. It is preferred that a period of time of the puddle-forming step is, for example, 30 sec. or less.

In the puddle-forming step, the film of the solvent F is formed on the substrate W. The film of the solvent F covers the entire top face of the substrate W. The film of the solvent F is relatively thick. Both the depressions 41 and the projections 43 are immersed in the solvent F.

<Step S13> Second Step

Figure 6E:
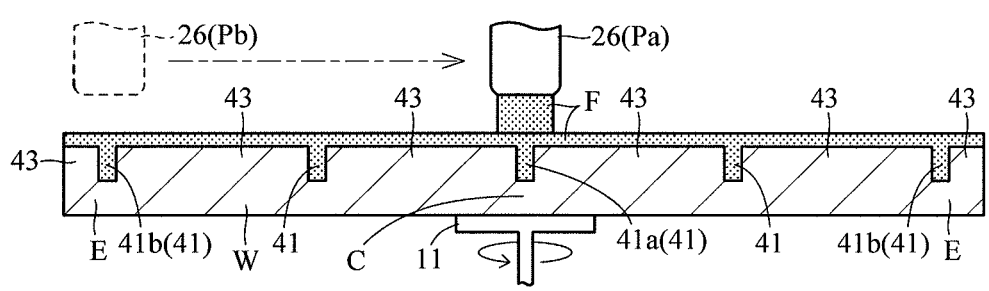

FIG. 6E schematically illustrates the second step. The second step is performed after the puddle-forming step. The second step is similar to the first step. The second step causes the substrate W to rotate at a second rotation speed R2, causes the solvent nozzle 26 to move between the central position Pa and the peripheral position Pb, and causes the solvent nozzle 26 to dispense the solvent F. Specifically, the second step causes the solvent nozzle 26 to move from the peripheral position Pb to the central position Pa. A movement direction of the solvent nozzle 26 in the second step is opposite to that in the first step. In the second step, movement of the solvent nozzle 26 from the peripheral position Pb to the central position Pa is performed once. The second step causes the solvent nozzle 26 to dispense the solvent F during the movement of the solvent nozzle 26 from the peripheral position Pb to the central position Pa.

The second rotation speed R2 is relatively low. Specifically, it is preferred that the second rotation speed R2 is higher than 0 rpm and lower than 500 rpm. It is more preferred that the second rotation speed R2 is higher than 0 rpm and equal to or lower than 300 rpm. It is much more preferred that the second rotation speed R2 is equal to or higher than 100 rpm and equal to or lower than 200 rpm.

The second rotation speed R2 may be equal to the first rotation speed R1. The second rotation speed R2 may be different from the first rotation speed R1.

It is preferred that the second rotation speed R2 is constant. It is preferred that a moving speed of the solvent nozzle 26 in the second step is constant.

A value obtained by dividing the reference value N by the second rotation speed R2 is referred to as a second reference time T2. See Mathematical Expression (3).

$$T2=N/R2 \qquad (3)$$

A number of rotations of the substrate W for a period of time when the solvent nozzle 26 moves from the peripheral position Pb to the central position Pa is equal to or more than the reference value N. In other words, the substrate W rotates a number of times equal to or more than the reference value N during the movement of the solvent nozzle 26 from the peripheral position Pb to the central position Pa. The period of time when the solvent nozzle 26 moves from the peripheral position Pb to the central position Pa is equal to or more than the second reference time T2. In other words, the solvent nozzle 26 moves from the peripheral position Pb to the central position Pa for a period of time equal to or more than the second reference time T2.

It is assumed, for example, that the radius r of the substrate W is 150 mm, the dimension D of the outlet 26a is 3 mm, and the second rotation speed R2 is 300 rpm. In this case, the reference value N is 50, and the second reference time T2 is 10 sec. (i.e., ⅙ min.). In other words, the substrate W rotates by 50 or more rounds during the movement of the solvent nozzle 26 from the peripheral position Pb to the central position Pa. The solvent nozzle 26 moves from the peripheral position Pb to the central position Pa for 10 sec. or more.

As noted above, when the second rotation speed R2 is higher than the first rotation speed R1, the second reference time T2 is shorter than the first reference time T1. When the second rotation speed R2 is twice the first rotation speed R1, the second reference time T2 is half the first reference time T1. This case achieves reduction in time required for the second step.

The solvent F drops onto both the center portion C and the peripheral portion E in the second step. That is, the solvent F drops onto the most portion of the substrate W. Consequently, the solvent F is supplied to the entire substrate W uniformly. The solvent F enters into the depressions 41.

<Step S14> Film-Thinning Step

Figure 6F:
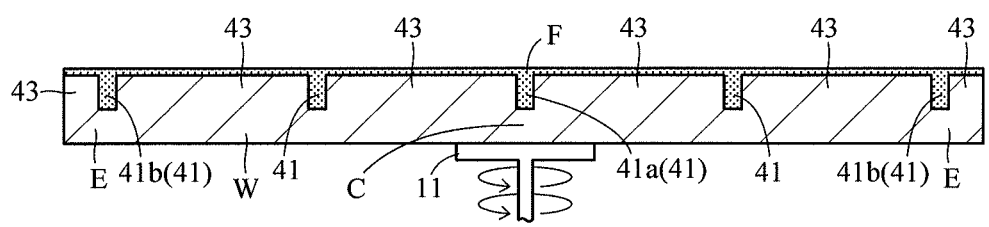

FIG. 6F schematically illustrates the film-thinning step. The film-thinning step is performed after the second step. The film-thinning step causes the substrate W to rotate and causes the solvent nozzle 26 to stop dispense of the solvent F.

The rotation speed of the substrate W in the film-thinning step is higher than the first rotation speed R1. The rotation speed of the substrate W in the film-thinning step is higher than the second rotation speed R2. It is preferred that the rotation speed of the substrate W in the film-thinning step is several hundreds to several thousands rpm. It is preferred that a period of time of the film-thinning step is, for example, 1 sec.

In the film-thinning step, the solvent F on the substrate W is thrown out. In the film-thinning step, the solvent F on the substrate W is scattered outside of the substrate W. In the film-thinning step, the film of the solvent F formed on the substrate W is thinned. The film-thinning step achieves a uniform thickness of the film of the solvent F over the substrate W. However, in the film-thinning step, the solvent F on the substrate W is not dried. The film of the solvent F still covers the entire top face of the substrate W when the film-thinning step is completed.

Along with the completion of the film-thinning step, the solvent supplying step is completed. After the solvent supplying step is completed, the chemical supplying step starts.

<Step S21> Center Dispensing Step

Figure 10A:
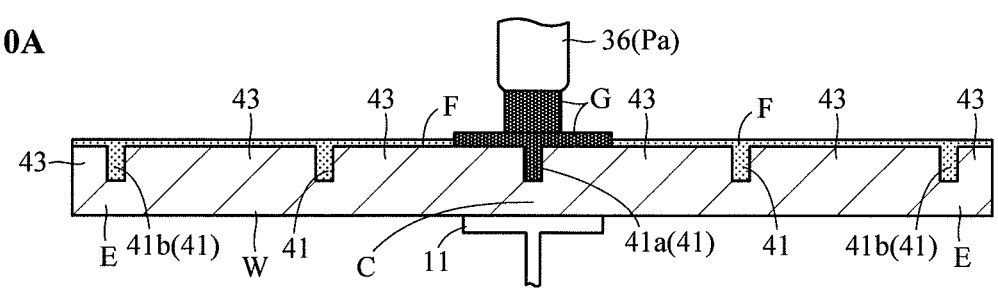
FIGS. 10A and 10B each schematically illustrates a chemical supplying step according to Embodiment 1.

FIG. 10A schematically illustrates a center-portion dispensing step. The center-portion dispensing step causes the chemical nozzle 36 to be at rest at the central position Pa, and causes the solvent nozzle 36 to dispense the chemical G. In the center-portion dispensing step, the substrate W may rotate or may be at rest.

The chemical G is supplied to the center portion C of the substrate W. The chemical G is supplied on the film of the solvent F. The chemical G enters into the depressions 41a.

<Step S22> Rotating Step

Figure 10B:
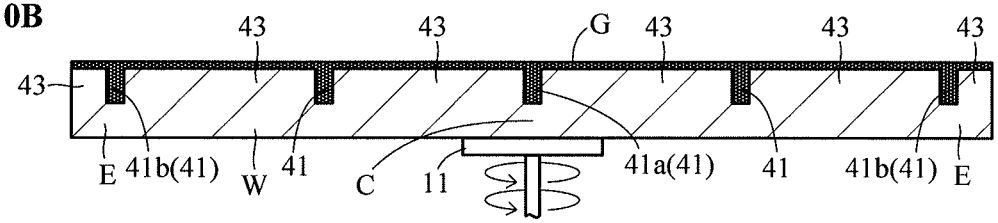

FIG. 10B schematically illustrates a rotating step. The rotating step is performed after the center-portion dispensing step. The rotating step causes the substrate W to rotate and causes the chemical nozzle 36 to stop dispense of the chemical G.

The chemical G spreads over the top face of the substrate W smoothly in a horizontal direction. The chemical G spreads over the entire top face of the substrate W. A coating film of the chemical G is formed on the substrate W.

The chemical G enters into the depressions 41. In other words, the solvent F in the depressions 41 is replaced by the chemical G smoothly. The depressions 41 are filled with the chemical G.

Along with completion of the rotating step, the chemical supplying step is completed. The coating method in Embodiment 1 is as above.

4. Comparison and Review of Embodiment 1 and Comparative Example

The following exemplifies procedures of a coating method according to a comparative example. Then, comparison is made between the coating method of Embodiment 1 and the coating method of the comparative example.

FIGS. 11A to 11D each schematically illustrate a coating method according to one comparative example. FIGS. 11A to 11D each illustrate the coating method according to the comparative example with the same numerals as Embodiment 1 for convenience.

The coating method according to the comparative example includes a solvent supplying step and a chemical supplying step.

Figure 11A:
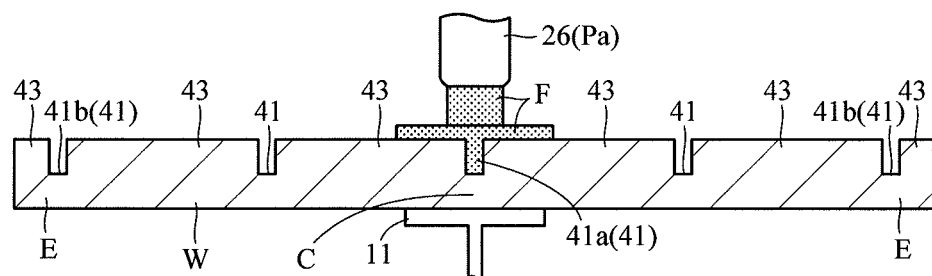
FIGS. 11A and 11D each schematically illustrate a coating method according to one comparative example.
Figure 11B:
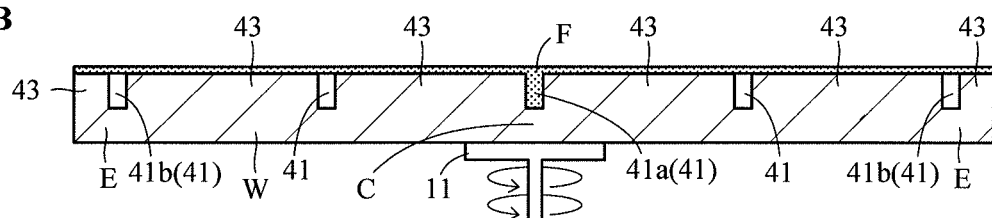

In the solvent supplying step, the solvent F is supplied to a center portion C of the substrate W at rest (FIG. 11A). Thereafter, in the solvent supplying step, the substrate W rotates (FIG. 11B). Accordingly, the solvent F spreads over the entire top face of the substrate W. The solvent F enters only into the depressions 41a. The solvent F does not enter into the depressions 41 other than the depressions 41a.

Figure 11C:
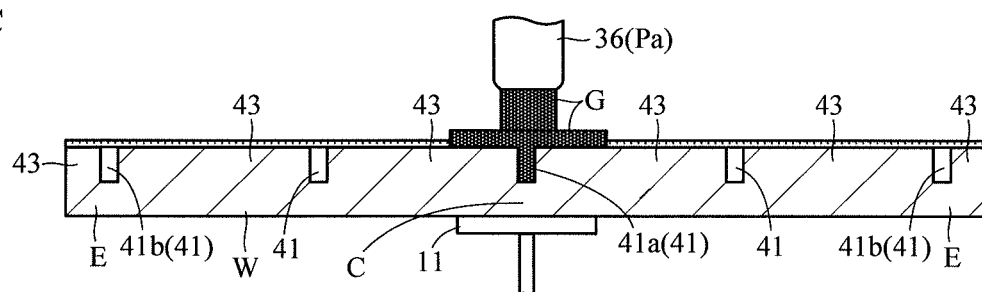
Figure 11D:
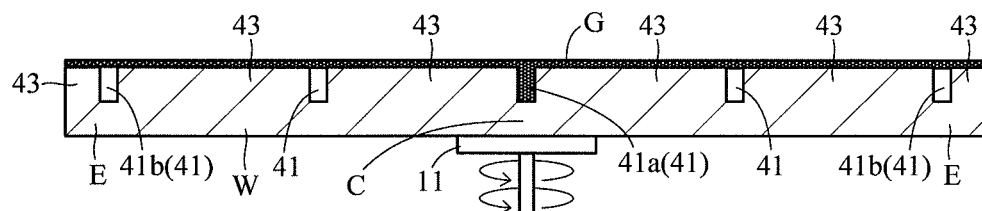

In the chemical supplying step, the chemical G is supplied to the center portion C of the substrate W (FIG. 11C). Thereafter, in the chemical supplying step, the substrate W rotates (FIG. 11D). Accordingly, the chemical G spreads over the top face of the substrate W. A coating film of the chemical G is formed on the substrate W. The chemical G enters only into the depressions 41a. The chemical G does not enter into the depressions 41 other than the depressions 41a.

As noted above, the chemical G fails to enter into the depressions 41 appropriately in the coating method of the comparative example. The chemical G does not enter into a plurality of depressions 41 in the same manner. An amount of the chemical G entering into the depressions 41 varies among the depressions 41. The chemical G enters into the depressions 41 in different ways depending on positions of the depressions 41.

The Inventors consider the reason why the chemical G fails to enter into the depressions 41 appropriately in the coating method of the comparative example as under.

Figure 12A:
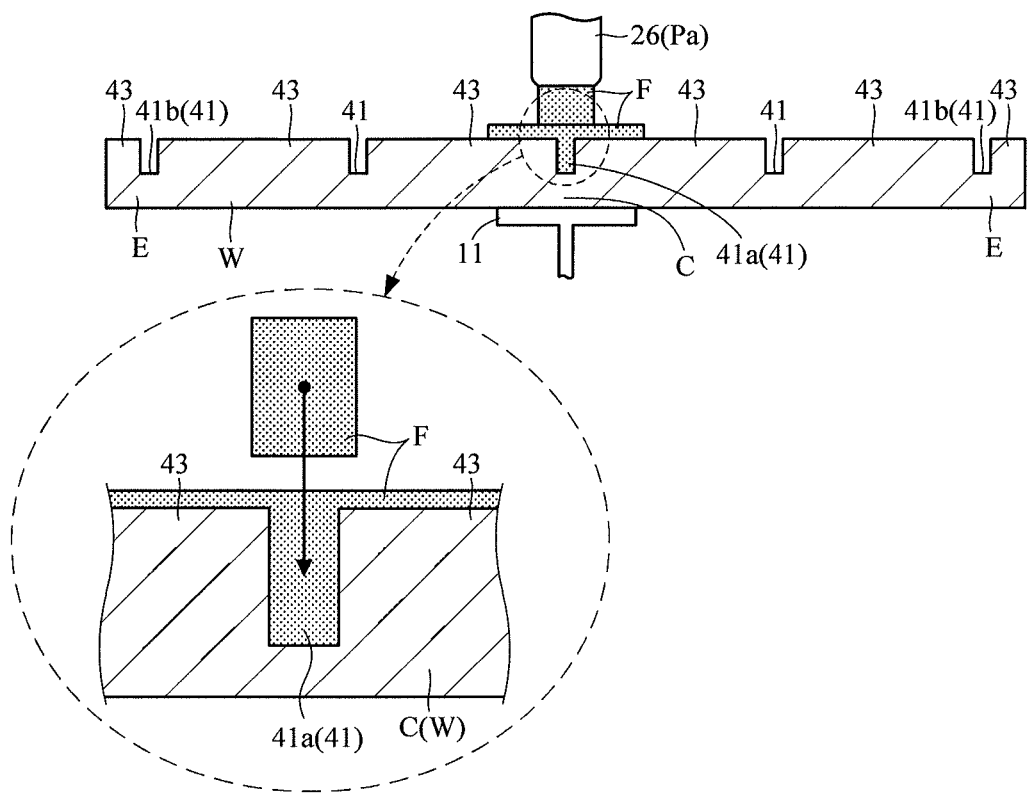
FIGS. 12A and 12B are each a conceptual view of the first step according to Embodiment 1.
Figure 12B:
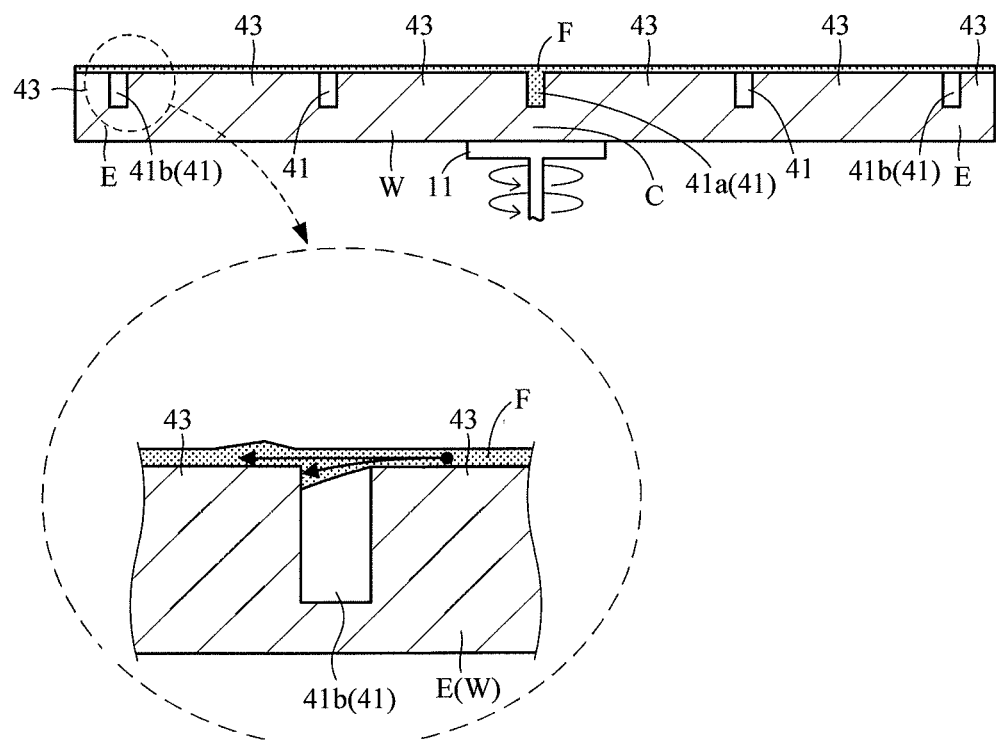

FIGS. 12A and 12B are each a conceptual view of the solvent supplying step in the comparative example. In the solvent supplying step of the comparative example, the substrate W is at rest, and the solvent F drops to the center portion C of the substrate W. Consequently, the solvent F is able to enter to the bottom of the depressions 41a easily (see FIG. 12A).

In the solvent supplying step of the comparative example, the solvent F does not drop down to regions other than the center portion C of the substrate W. The solvent F merely flows substantially horizontally in the regions other than the center portion C of the substrate W. As a result, the solvent F is unlikely to enter into the depressions 41 other than the depressions 41a (see FIG. 12B).

As a result, in the chemical supplying step of the comparative example, the chemical G is able to enter into the depressions 41a smoothly, but is unlikely to enter into the depressions 41 other than the depressions 41a.

As noted above, the solvent F fails to enter into the depressions 41 in the same manner in the coating method of the comparative example, leading to inappropriate coating of the substrate W with the chemical G.

In contrast to this, as mentioned above, the chemical G enters into the depressions 41 appropriately regardless of the position of the depressions 41 in the coating method of Embodiment 1. The chemical G enters into any of the depressions 41 in the same manner in the coating method of Embodiment 1. The Inventors consider the reason why the chemical G enters into the depressions 41 appropriately in the coating method of Embodiment 1 as under.

Figure 13A:
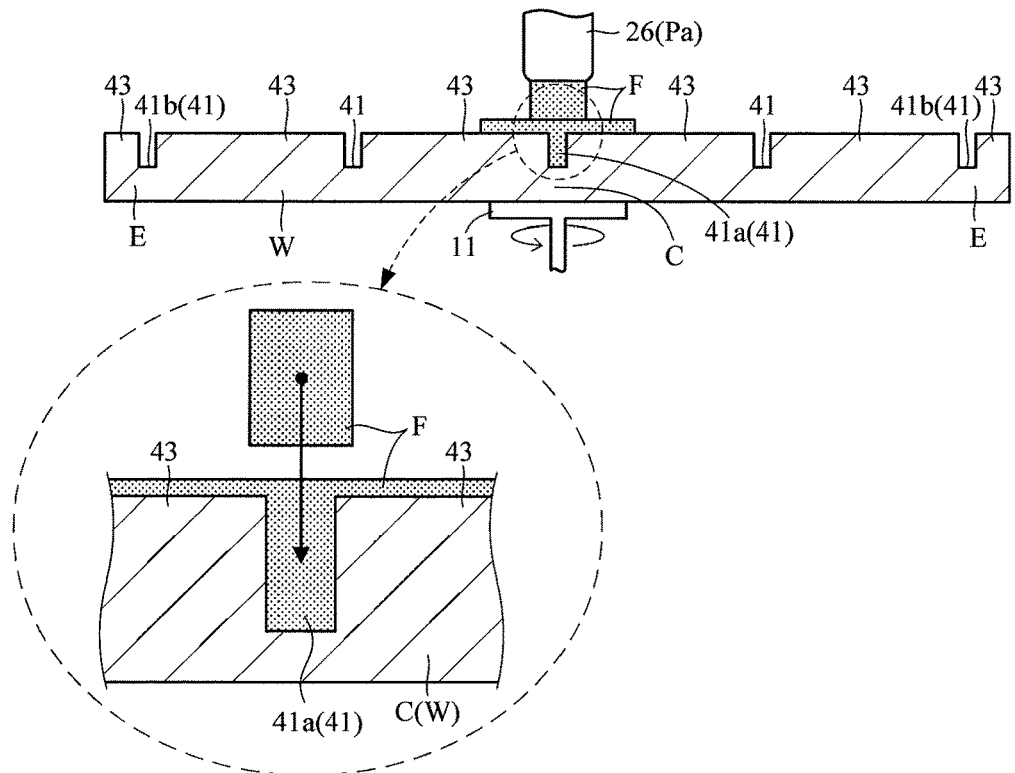
FIGS. 13A and 13B are each a conceptual view of a solvent supplying step in the comparative example.
Figure 13B:
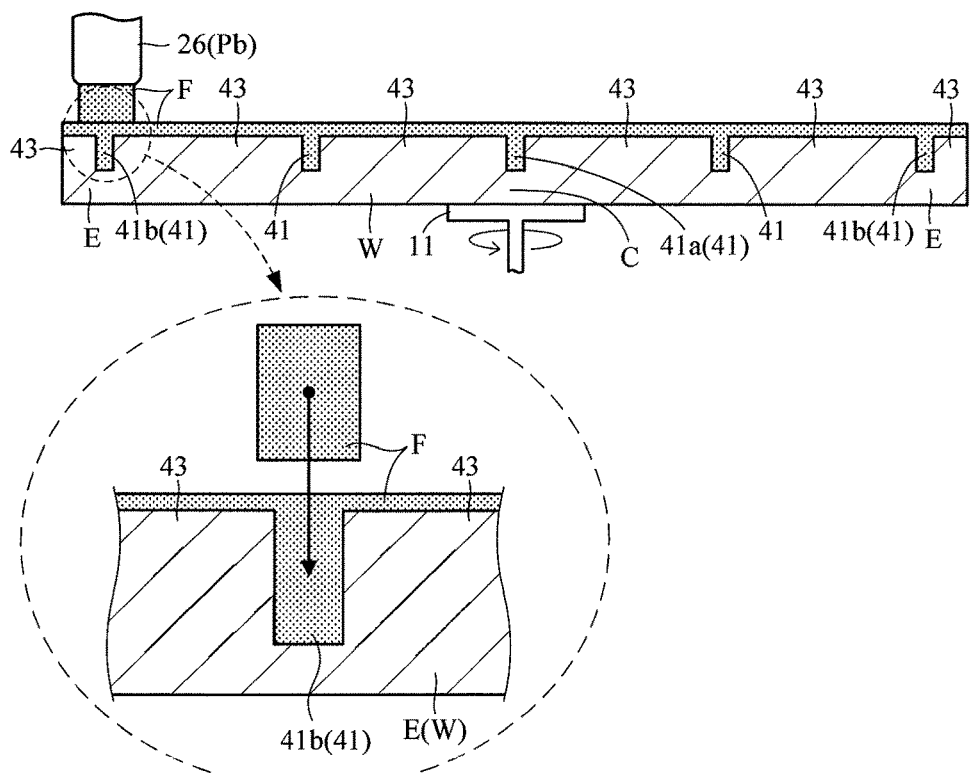

FIGS. 13A and 13B are each a conceptual view of the first step in Embodiment 1. In the first step, the first rotation speed R1 is relatively low, and the solvent F drops onto the center portion C of the substrate W. Consequently, when dropping down to the center portion C, the solvent F is hardly shifted in a direction where the substrate W rotates. In other words, energy of downward movement of the solvent F is unlikely to be distributed even when the solvent F drops down onto the substrate W. Consequently, the solvent F is able to enter to the bottom of the depressions 41a easily (see FIG. 13A).

Moreover, in the first step, the substrate W rotates the number of times equal to or more than the reference value N in the period of time during the movement of the solvent nozzle 26 from the central position Pa to the peripheral position Pb. In the first step, the solvent nozzle 26 moves from the central position Pa to the peripheral position Pb for a period of time equal to or more than the first reference time T1. Consequently, the solvent F drops onto the most portion of the substrate W. As a result, the solvent F is able to enter easily to the bottoms of the depressions 41 other than the depressions 41a (see FIG. 13B).

Accordingly, the chemical G enters into any of the depressions 41 smoothly in the chemical supplying step of Embodiment 1.

As noted above, the solvent F enters into the depressions 41 in the same manner in the coating method of Embodiment 1, resulting in appropriate coating of the substrate W with the chemical G.

5. Effect of Embodiment 1

The coating method of Embodiment 1 produces the following effects.

The first step causes the substrate W to rotate at a first rotation speed R1, and causes the solvent nozzle 26 to move between the central position Pa and the peripheral position Pb while causing the solvent nozzle 26 to dispense the solvent F. When the solvent nozzle 26 is located at the central position Pa, the solvent nozzle 26 dispenses the solvent F to the center portion C. When the solvent nozzle 26 is located at the peripheral position Pb, the solvent nozzle 26 dispenses the solvent F to the peripheral portion E. As noted above, the solvent F is supplied to both the center portion C and the peripheral portion E in the same manner in the first step. Consequently, the solvent F is able to be supplied to the entire substrate W uniformly in the first step. Accordingly, the chemical supplying step allows the chemical G to spread over the substrate W. Consequently, the substrate W is able to be coated with the chemical G uniformly in the chemical supplying step. As noted above, the coating method allows appropriate coating of the substrate W with the chemical G.

In addition, the solvent F is able to be supplied to the entire substrate W efficiently in the first step. Consequently, the solvent F is able to be supplied to the entire substrate W uniformly while a usage amount of the solvent F is suppressed.

The first rotation speed R1 is relatively low, and thus the solvent F is able to enter into the depressions 41 easily. The solvent F enters into the depressions 41, whereby the chemical G enters into the depressions 41 smoothly in the chemical supplying step. Consequently, the depressions 41 are able to be filled with the chemical G suitably.

When the first rotation speed R1 is higher than 0 rpm and lower than 500 rpm, the solvent F is able to enter into the depressions 41 smoothly. When the first rotation speed R1 is higher than 0 rpm and equal to or lower than 300 rpm, the solvent F is able to enter into the depressions 41 more smoothly. When the first rotation speed R1 is equal to or higher than 100 rpm and equal to or lower than 200 rpm, the solvent F is able to enter into the depressions 41 much more smoothly.

The number of rotations of the substrate W in a period of time during the movement of the solvent nozzle 26 between the central position Pa and the peripheral position Pb in the first step is equal to or more than the reference value N. As a result, the solvent F falls onto the most portion of the substrate W in the first step. Consequently, the solvent F is able to be supplied to the entire substrate W more uniformly in the first step.

A period of time during the movement of the solvent nozzle 26 between the central position Pa and the peripheral position Pb in the first step is equal to or more than the first reference time T1. As a result, the solvent F falls onto the most portion of the substrate W in the first step. Consequently, the solvent F is able to be supplied to the entire substrate W more uniformly in the first step.

The first step causes the solvent nozzle 26 to dispense the solvent F at the central position Pa before dispensing at the peripheral position Pb. When the solvent nozzle 26 is located at the central position Pa, the solvent nozzle 26 is able to supply the solvent F to the substrate W smoothly. When the solvent nozzle 26 is located at the peripheral position Pb, the solvent nozzle 26 may drop onto a peripheral edge of the substrate W, leading to large scatter of the solvent F. In contrast to this, when the solvent nozzle 26 is located at the central position Pa, the solvent F has no possibility of being scattered largely.

Moreover, in the first step, the solvent nozzle 26 moves from the central position Pa to the peripheral position Pb. Accordingly, the solvent F is able to be supplied continuously from the center portion C to the peripheral portion E of the substrate W smoothly.

In the first step, the solvent nozzle 26 starts to dispense the solvent F from the central position Pa. Consequently, the solvent F is able to be supplied smoothly in the first step.

The solvent F dispensed from the solvent nozzle 26 flows downwardly in a rod shape. Accordingly, the solvent nozzle 26 allows the solvent F to drop down onto the substrate W suitably.

The solvent supplying step includes the puddle-forming step. Accordingly, the substrate W is able to be impregnated with the solvent F suitably. Moreover, the solvent F is able to enter into the depressions 41 more easily.

The solvent supplying step includes the second step similar to the first step. Consequently, the solvent F is able to be supplied to the entire substrate W more uniformly.

The second rotation speed R2 is relatively low, and thus the solvent F is able to enter into the depressions 41 easily.

When the second rotation speed R2 is higher than 0 rpm and lower than 500 rpm, the solvent F is able to enter into the depressions 41 smoothly. When the second rotation speed R2 is higher than 0 rpm and equal to or lower than 300 rpm, the solvent F is able to enter into the depressions 41 more smoothly. When the second rotation speed R2 is equal to or higher than 100 rpm and equal to or lower than 200 rpm, the solvent F is able to enter into the depressions 41 much more smoothly.

The number of rotations of the substrate W for the period of time during the movement of the solvent nozzle 26 between the central position Pa and the peripheral position Pb in the second step is equal to or more than the reference value N. Consequently, the solvent F falls onto the most portion of the substrate W in the same manner. As a result, the solvent F is able to be supplied to the entire substrate W more uniformly in the second step.

A period of time during the movement of the solvent nozzle 26 between the central position Pa and the peripheral position Pb in the second step is equal to or more than the second reference time T2. Consequently, the solvent F falls onto the most portion of the substrate W in the same manner. As a result, the solvent F is able to be supplied to the entire substrate W more uniformly in the second step.

The solvent supplying step includes the film-thinning step. This achieves a suitably thinned film of the solvent F. In the chemical supplying step, the chemical G is supplied to the thin film of the solvent F. As a result, a coating film of the chemical G with a substantially uniform thickness is formable on the substrate W. This results in suitable prevention of variation in thickness of the coating film of the chemical G.

The substrate W is circular in plan view. As a result, the solvent F is able to be supplied to the entire substrate W uniformly in the solvent supplying step. Likewise, the chemical G is able to be supplied to the entire substrate W uniformly in the chemical supplying step.

The substrate W includes depressions 41. Also, in this case, the solvent F is able to be supplied to the entire substrate W uniformly in the solvent supplying step of the present coating method. As a result, the chemical supplying step allows appropriate coating of the substrate W with the chemical G. As noted above, the present coating method possesses high utility especially when the substrate W includes the depressions 41.

Embodiment 2

The following describes Embodiment 2 of the present invention with reference to drawings. Like numerals are used to identify like components which are the same as in Embodiment 1, and the components will not particularly be described.

The substrate treating apparatus 1 in Embodiment 2 has substantially the same outline as that of Embodiment 1. Accordingly, the description about the outline of the substrate treating apparatus 1 of Embodiment 2 is to be omitted.

1. Chemical Nozzle 36 and its Associated Configuration

Figure 14:
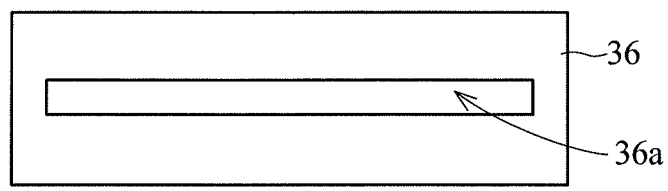
FIG. 14 is a bottom view of a chemical nozzle.

FIG. 14 is a bottom view of the chemical nozzle 36. The chemical nozzle 36 is a slit nozzle. The chemical nozzle 36 has an outlet 36a through which the chemical G is dispensed. The outlet 36a is formed in the lower face of the chemical nozzle 36. The outlet 36a is elongated. The outlet 36a is substantially rectangular.

Figure 15:
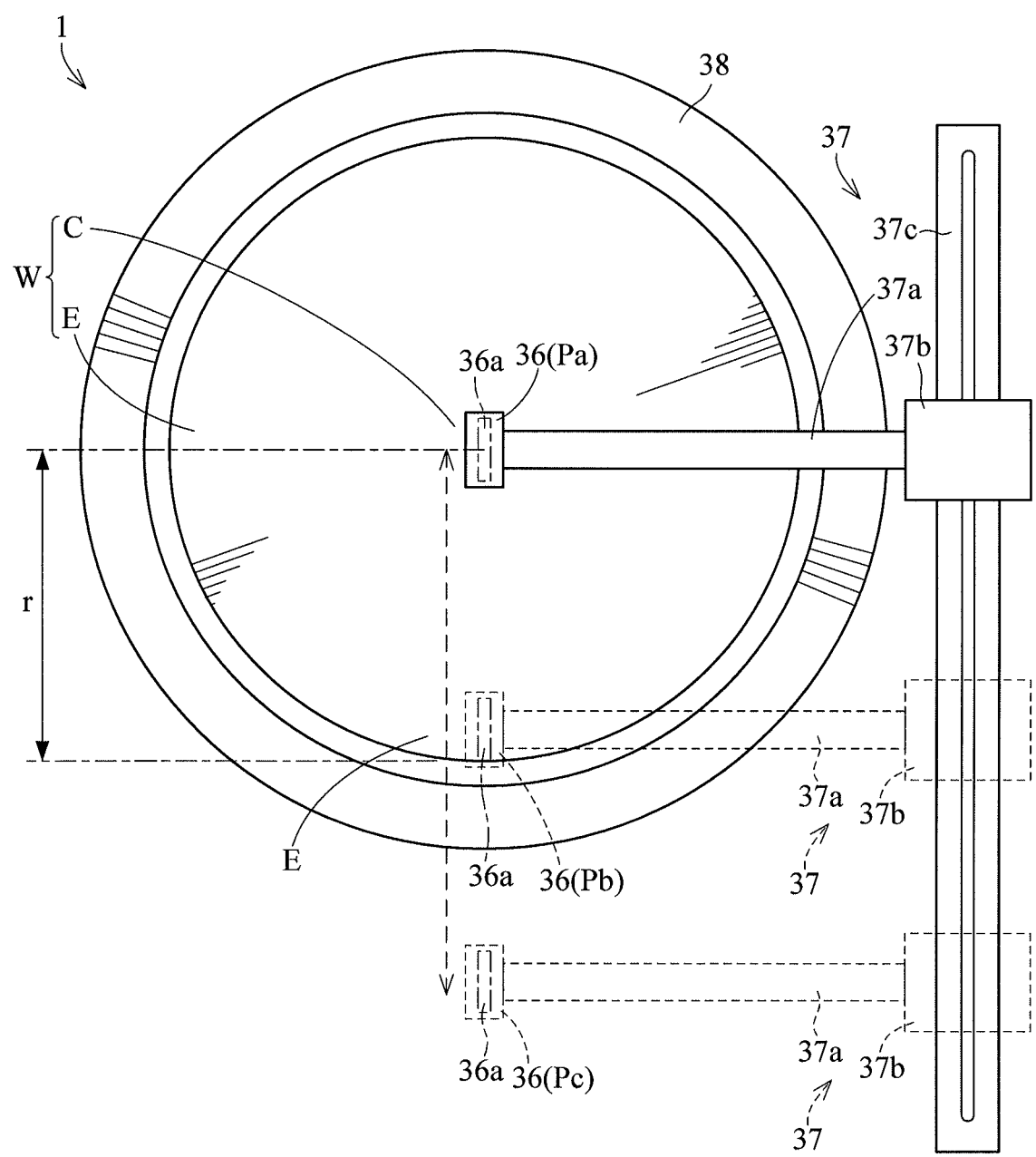
FIG. 15 is a plan view of a substrate treating apparatus according to Embodiment 2 of the present invention.

FIG. 15 is a plan view of the substrate treating apparatus 1. FIG. 15 omits illustration of the moving mechanism 27.

The moving mechanism 37 includes an arm 37a, a shaft 37b, and a drive unit 37c. The arm 37a extends substantially horizontally. The arm 37a has a distal end for holding the chemical nozzle 36. The chemical nozzle 36 is disposed higher in level than the substrate W held by the spin holder 11. The chemical nozzle 36 is disposed such that a longitudinal direction of the outlet 36a conforms to a radial direction of the substrate W in plan view. The arm 37a has a proximal end connected to the shaft 37b. The shaft 37b supports the arm 37a. The shaft 37a extends substantially vertically. The drive unit 37c is coupled to the shaft 37b. The drive unit 37c causes the shaft 37b to move substantially horizontally. The drive unit 37b is disposed outwardly of the scatter preventive cup 38. The drive unit 37c moves the shaft 37b, thereby moving the chemical nozzle 36 substantially horizontally. More specifically, the chemical nozzle 36 moves along the longitudinal direction of the outlet 36a in plan view. The chemical nozzle 36 moves toward the center portion C of the substrate W while the longitudinal direction of the outlet 36a conforms to the radial direction of the substrate W in plan view.

The moving mechanism 37 moves the chemical nozzle 36 among the central position Pa, the peripheral position Pb, and the retracting position Pc. Here, the central position Pa overlaps the center portion C of the substrate W in plan view. The peripheral position Pb overlaps the peripheral portion E of the substrate W in plan view. The retracting position Pc does not overlap the substrate W in plan view.

The central position Pa of the chemical nozzle 36 may be equal to or different from the central position Pa of the solvent nozzle 26. The same is applicable to the peripheral position Pb and the retracting position Pc of the chemical nozzle 36.

3. Coating Method of Embodiment 2

Figure 16:
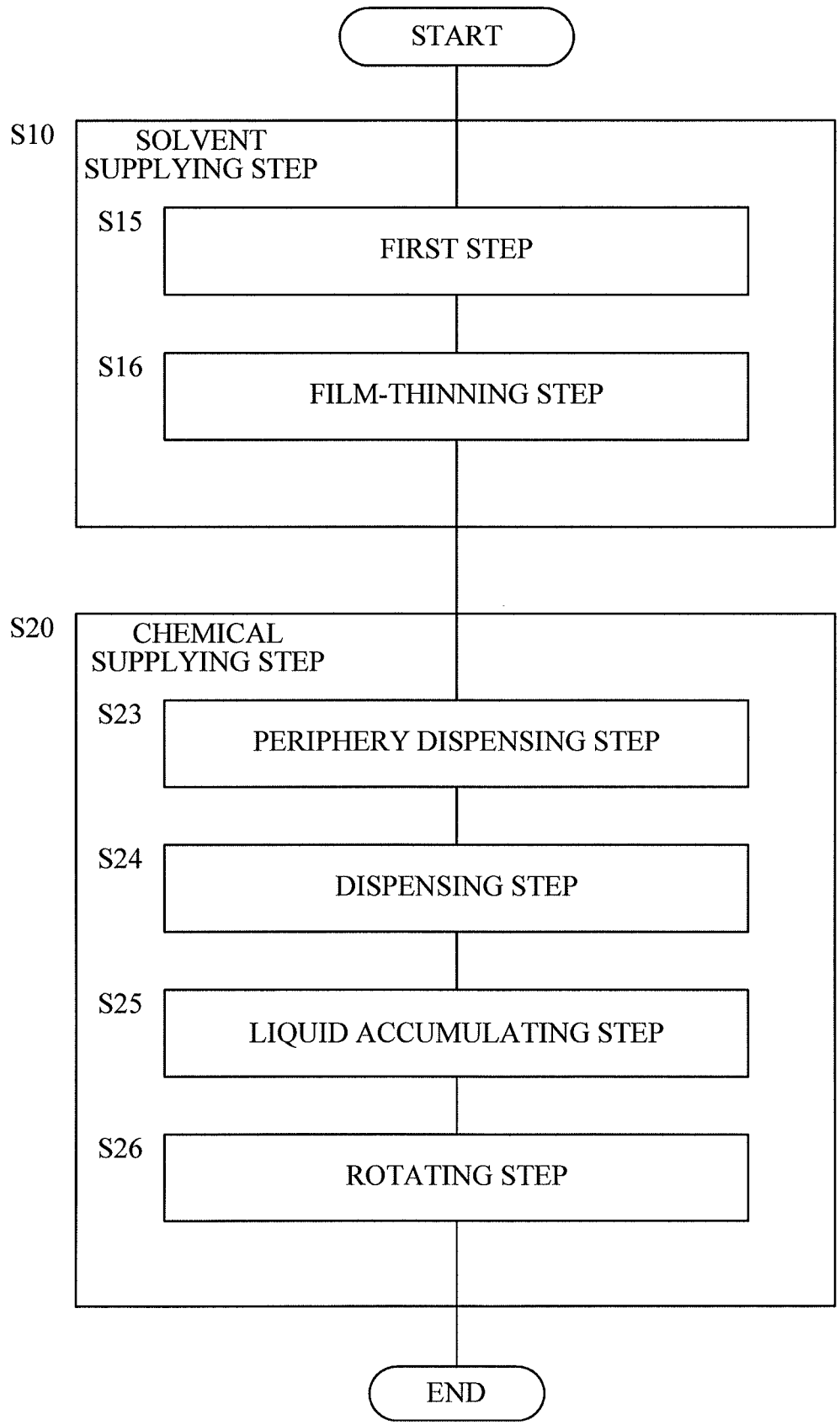
FIG. 16 is a flow chart of procedures in a coating method according to Embodiment 2.

Here, exemplified is the coating method performed by the substrate treating apparatus 1. FIG. 16 is a flow chart of procedures in the coating method according to Embodiment 2. The coating method includes a solvent supplying step (Step S10) and a chemical supplying step (Step S20).

The solvent supplying step includes a first step (Step S15) and a film-thinning step (Step S16). The chemical supplying step includes a periphery dispensing step (Step S23), a dispensing step (Step S24), a liquid accumulating step (Step S25), and a rotating step (Step S26). Now each of the steps is to be described.

<Step S15> First Step

Figure 17A:
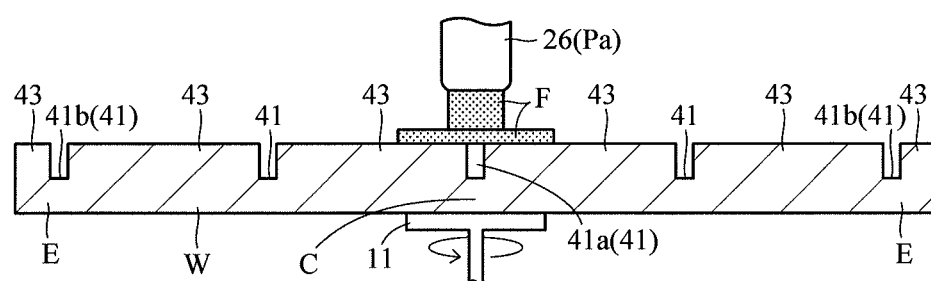
FIG. 17A to 17C each schematically illustrate a solvent supplying step according to Embodiment 2.
Figure 17B:
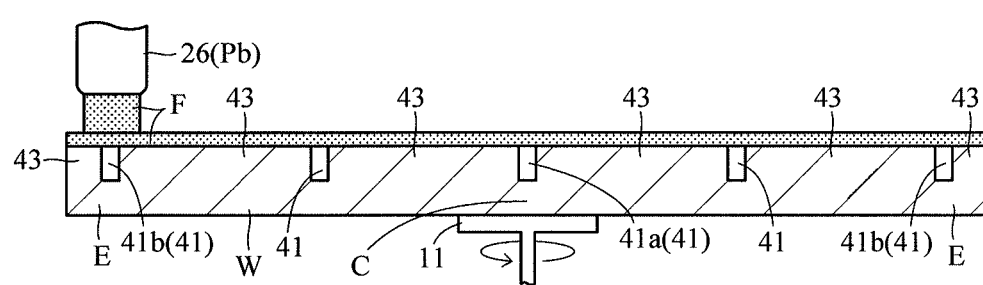

FIGS. 17A and 17B each schematically illustrates the first step. The first step causes the substrate W to rotate at a first rotation speed R1, causes the solvent nozzle 26 to move between the central position Pa and the peripheral position Pb, and causes the solvent nozzle 26 to dispense the solvent F. More specifically, the first step causes the solvent nozzle 26 to move from the central position Pa to the peripheral position Pb. In the first step, movement of the solvent nozzle 26 from the central position Pa to the peripheral position Pb is performed once. The first step causes the solvent nozzle 26 to dispense the solvent F during the movement of the solvent nozzle 26 from the central position Pa to the peripheral position Pb.

The solvent F drops down from the solvent nozzle 26 vertically. The dropping solvent F has a rod or column shape. That is, the solvent F dispensed from the solvent nozzle 26 has a rod or column shape. A liquid column of the solvent F is formed between the solvent nozzle 26 and the substrate W. The liquid column of the solvent F extends substantially vertically.

The solvent F falls down to the top face of the substrate W. That is, the solvent F contacts the top face of the substrate W. The solvent F drops down substantially perpendicularly relative to the top face of the substrate W. After dropping down to the substrate W, the solvent F spreads over the top face of the substrate W substantially horizontally.

The first rotation speed R1 is relatively high. Specifically, it is preferred that the first rotation speed R1 is equal to or higher than 500 rpm. It is preferred that the first rotation speed R1 is equal to or less than 1,000 rpm.

It is preferred that the first rotation speed R1 is constant. It is preferred that a moving speed of the solvent nozzle 26 in the first step is constant.

Reference is made to FIG. 17A. When the solvent nozzle 26 is located at the central position Pa, the solvent F dispensed from the solvent nozzle 26 drops to the depressions 41a. The solvent F drops down from directly above the depressions 41a to the depressions 41a. The first rotation speed R1 is relatively high, and thus the solvent F is unlikely to enter into the depressions 41a. The first rotation speed R1 is relatively high, and thus the solvent F easily flows over the top face of the substrate W substantially horizontally.

Reference is made to FIG. 17B. When the solvent nozzle 26 is located at the peripheral position Pb, the solvent F dispensed from the solvent nozzle 26 drops to the depressions 41b. The solvent F drops down from directly above the depressions 41b to the depressions 41b. The first rotation speed R1 is relatively high, and thus the solvent F is unlikely to enter into the depressions 41b. The first rotation speed R1 is relatively high, and thus the solvent F easily flows over the top face of the substrate W substantially horizontally.

In addition, a film of the solvent F is formed on the top face of the substrate W. The film of the solvent F lies over the top face of the substrate W. The film of the solvent F covers the entire top face of the substrate W.

As a result, the depressions 41 are not filled with the solvent F, but the upper portions of the depressions 41 are covered with the film of the solvent F. The film of the solvent F functions as a lid for closing spaces of the depressions 41. Hereunder, covering the upper portions of the depressions 41 with the solvent F without filling the depressions 41 with the solvent F are referred to as "tenting the depressions 41 with the solvent F".

A number of rotations of the substrate W in a period of time when the solvent nozzle 26 moves from the central position Pa to the peripheral position Pb is within a range in plus or minus 20% of the reference value N. In other words, the substrate W rotates a number of times equal to or more than 80% and equal to or less than 120% of the reference value N during the movement of the solvent nozzle 26 from the central position Pa to the peripheral position Pb. The period of time when the solvent nozzle 26 moves from the central position Pa to the peripheral position Pb is within a range in plus or minus 20% of the first reference time T1. In other words, the solvent nozzle 26 moves from the central position Pa to the peripheral position Pb for a period of time equal to or more than 80% and equal to or less than 120% of the first reference time T1.

It is assumed, for example, that the radius r of the substrate W is 150 mm, the dimension D of the outlet 26a is 3 mm, and the first rotation speed R1 is 600 rpm. In this case, the reference value N is 50, and the first reference time T1 is 5 sec. (i.e., 1/12 min.). Consequently, it is preferred that the substrate W rotates the number of times equal to or more than 40 and equal to or less than 60 during the movement of the solvent nozzle 26 from the central position Pa to the peripheral position Pb. The solvent nozzle 26 moves from the central position Pa to the peripheral position Pb for 4 sec., or more and 6 sec. or less.

The solvent nozzle 26 moves from the central position Pa to the peripheral position Pb, whereby the drop area B is shifted from the center portion C to the peripheral portion E. The solvent nozzle 26 moves and the substrate W rotates, whereby the drop area B is shifted in a spiral (helical) manner around the center portion C.

The substrate W rotates the number of times within a range in plus or minus 20% of the reference value N for a period of time when the solvent nozzle 26 moves from the central position Pa to the peripheral position Pb. The solvent nozzle 26 moves from the central position Pa to the peripheral position Pb in a period of time within a range in plus or minus 20% of the first reference time T1. This causes the drop area B to occupy the most portion of the top face of the substrate W. That is, the solvent F drops onto the most portion of the substrate W.

As noted above, the solvent F drops onto both the center portion C and the peripheral portion E in the first step. That is, the solvent F drops onto the most portion of the substrate W. Consequently, the solvent F is supplied to the entire substrate W uniformly. The solvent F does not enter into the depressions 41. The depressions 41 are tented with the solvent F.

Figure 17C:
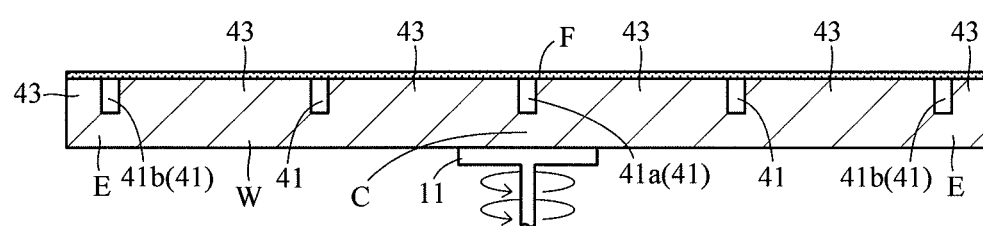

<Step S16> Film-Thinning Step FIG. 17C schematically illustrates the film-thinning step. The film-thinning step is performed after the first step. The film-thinning step causes the substrate W to rotate and causes the solvent nozzle 26 to stop dispense of the solvent F.

The rotation speed of the substrate W in the film-thinning step is higher than the first rotation speed R1. It is preferred that the rotation speed of the substrate W in the film-thinning step is several hundreds to several thousands rpm. It is preferred that a period of time of the film-thinning step is, for example, 1 sec.

In the film-thinning step, the solvent F on the substrate W is thrown out. In the film-thinning step, the solvent F on the substrate W is scattered outside of the substrate W. In the film-thinning step, the film of the solvent F formed on the substrate W is thinned. The film-thinning step achieves a uniform thickness of the film of the solvent F over the substrate W. However, in the film-thinning step, the solvent F on the substrate W is not dried. The film of the solvent F still covers the entire top face of the substrate W when the film-thinning step is completed. At completion of the film-thinning step, the depressions 41 are continuously tented with the solvent F.

Along with the completion of the film-thinning step, the solvent supplying step is completed. As noted above, the first step and the film-thinning step are only performed in the solvent supplying step.

<Step S20> Chemical Supplying Step

In the chemical supplying step, the chemical G with relatively high viscosity is supplied. It is preferred that the chemical G has viscosity of 200 cP or more. It is more preferred that the chemical G has viscosity of 400 cP or more.

Figure 18A:
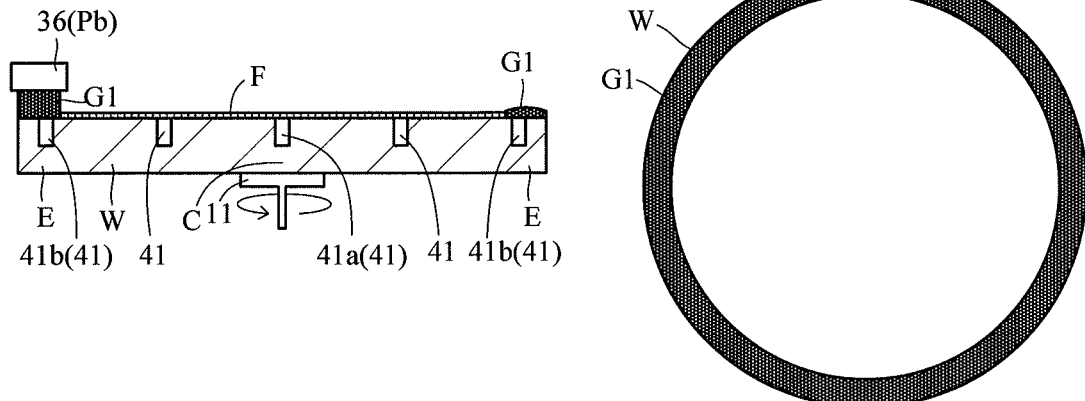
FIG. 18A to 18C each schematically illustrate a chemical supplying step according to Embodiment 2.
Figure 18B:
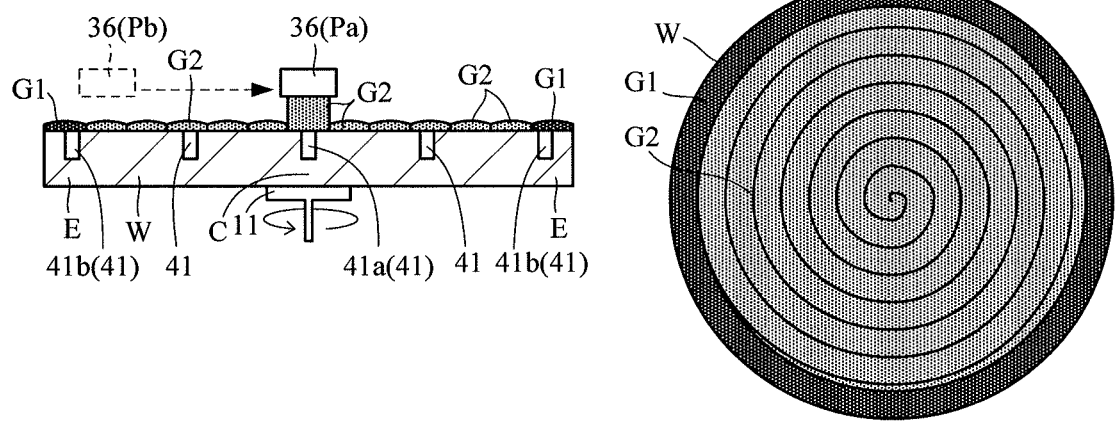
Figure 18C:
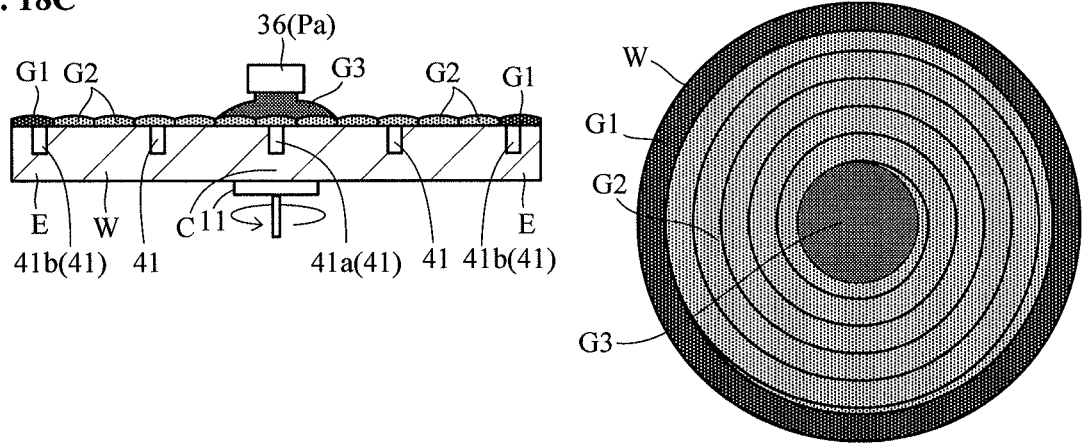

FIGS. 18A to 18C each schematically illustrate a chemical supplying step according to Embodiment 2. FIGS. 18A to 18C each illustrate a plan view on the right side thereof. FIGS. 18A to 18C each illustrate a side view on the left side thereof.

In the chemical supplying step, the chemical G is dispensed in the periphery dispensing step, the dispense step, and the liquid accumulating step. Where the chemical to be dispensed is distinguished in every step, the chemical G dispensed in the periphery dispensing step is referred to as a "chemical G1", the chemical G dispensed in the dispense step as a "chemical G2", and the chemical G dispensed in the liquid accumulating step as a "chemical G3".

<Step S23> Periphery Dispensing Step

FIG. 18A schematically illustrates the periphery dispensing step. The periphery dispensing step causes the substrate W to rotate, causes the chemical nozzle 36 to be at rest at the peripheral position Pb, and causes the chemical nozzle 36 to dispense the chemical G1. The periphery dispensing step causes the substrate W to rotate by 1 or more rotations. The periphery dispensing step causes the nozzle 36 to dispense the chemical G1 for a period of time when the substrate W rotates by one or more rounds.

The chemical G1 is supplied to the peripheral portion E. The chemical G1 is supplied like being put on to the peripheral portion E. Since the depressions 41 are tented with the solvent F, the chemical G1 does not enter into the depressions 41b.

<Step S24> Dispensing Step FIG. 18B schematically illustrates the dispensing step. The dispense step is performed after the periphery dispensing step. The dispense step causes the substrate W to rotate, causes the chemical nozzle 36 to move between the central position Pa and the peripheral position Pb, and causes the chemical nozzle 36 to dispense the chemical G2. Specifically, the dispense step causes the chemical nozzle 36 to move from the peripheral position Pb to the central position Pa. It is preferred that the chemical nozzle 36 moves radially during one rotation of the substrate W by a distance equal to or less than a length of the outlet 36a in the longitudinal direction. The dispense step causes the chemical nozzle 36 to dispense the chemical G2 for a period of time when the chemical nozzle 36 moves from the peripheral position Pb to the central position Pa.

The chemical G2 is supplied inwardly of the peripheral portion E. The chemical G2 is supplied like being put on the substrate W. The chemical G2 on the substrate W extends in a spiral (helical) shape in plan view. The chemical G2 is supplied to the substrate W so as to be disposed on the spiral (helical) shape plan view. The chemical G2 is supplied like being put without any clearance. Since the depressions 41 are tented with the solvent F, the chemical G2 does not enter into the depressions 41.

<Step S25> Liquid Accumulating Step

FIG. 18C schematically illustrates the liquid accumulating step. The liquid accumulating step is performed after the dispense step. The liquid accumulating step causes the chemical nozzle 36 to be at rest at the central position Pa, and causes the chemical nozzle 36 to dispense the chemical G3. In the liquid accumulating step, the substrate W may rotate or may be at rest.

The chemical G3 is supplied to the center portion C. Accordingly, accumulation of the chemical G3 is formed at the center portion C. The accumulation of the chemical G3 builds upwardly rather than the chemicals G1 and G2. An amount of the chemical G per unit area at the center portion C is larger than that at portions other than the center portion C of the substrate W. Since the depressions 41a are tended with the solvent F, the chemical G3 does not enter into the depressions 41a.

<Step S26> Rotating Step

Figure 19:
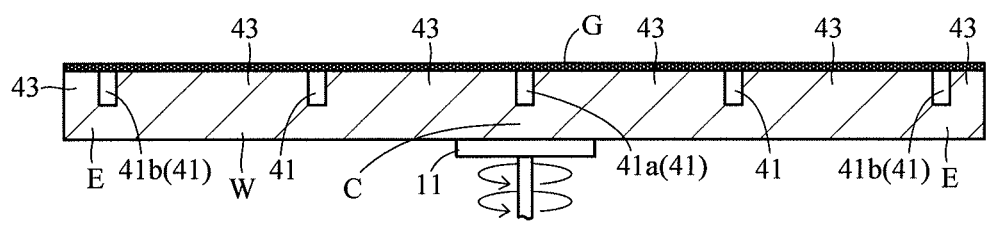
FIG. 19 illustrates a rotating step according to Embodiment 2.

FIG. 19 schematically illustrates a rotating step. The rotating step is performed after the liquid accumulating step. The rotating step causes the substrate W to rotate and causes the chemical nozzle 36 to stop dispense of the chemical G The chemical G spreads over the top face of the substrate W smoothly in a substantially horizontal direction. Especially, the chemical G3 spreads smoothly in a substantially horizontal direction. The chemical G spreads over the entire top face of the substrate W. A coating film of the chemical G is formed on the substrate W.

Since the depressions 41 are tented with the solvent F, the chemical G does not enter into the depressions 41. The depressions 41 are not filled with the chemical G, but the upper portions of the depressions 41 are covered with the coating film of the chemical G. The coating film of the chemical G functions as a lid for closing a space of the depressions 41. Hereunder, covering the upper portions of the depressions 41 with the chemical G without filling the depressions 41 with the chemical G is referred to as "tenting the depressions 41 with the solvent G".

Along with completion of the rotating step, the chemical supplying step is completed. The coating method in Embodiment 2 is as above.

3. Review of Embodiment 2

The Inventors consider the reason why the depressions 41 are able to be tented appropriately with the chemical G in the coating method of Embodiment 2 as under.

Figure 20A:
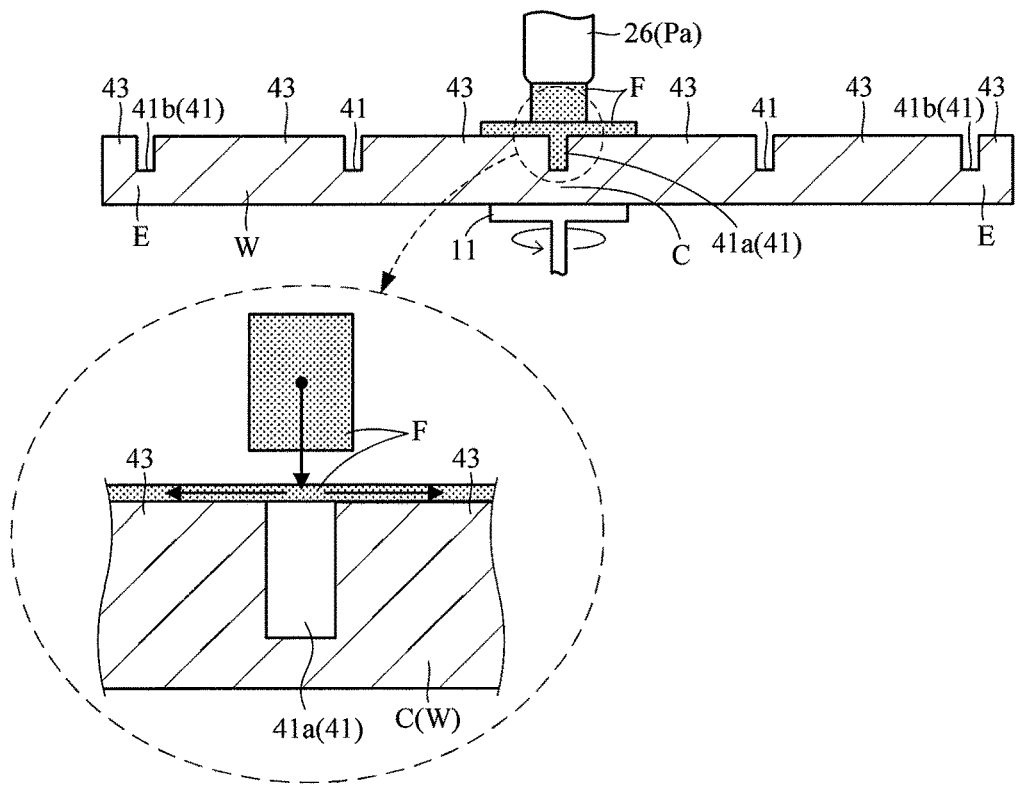
FIGS. 20A and 20B are each a conceptual view of a first step according to Embodiment 2.
Figure 20B:
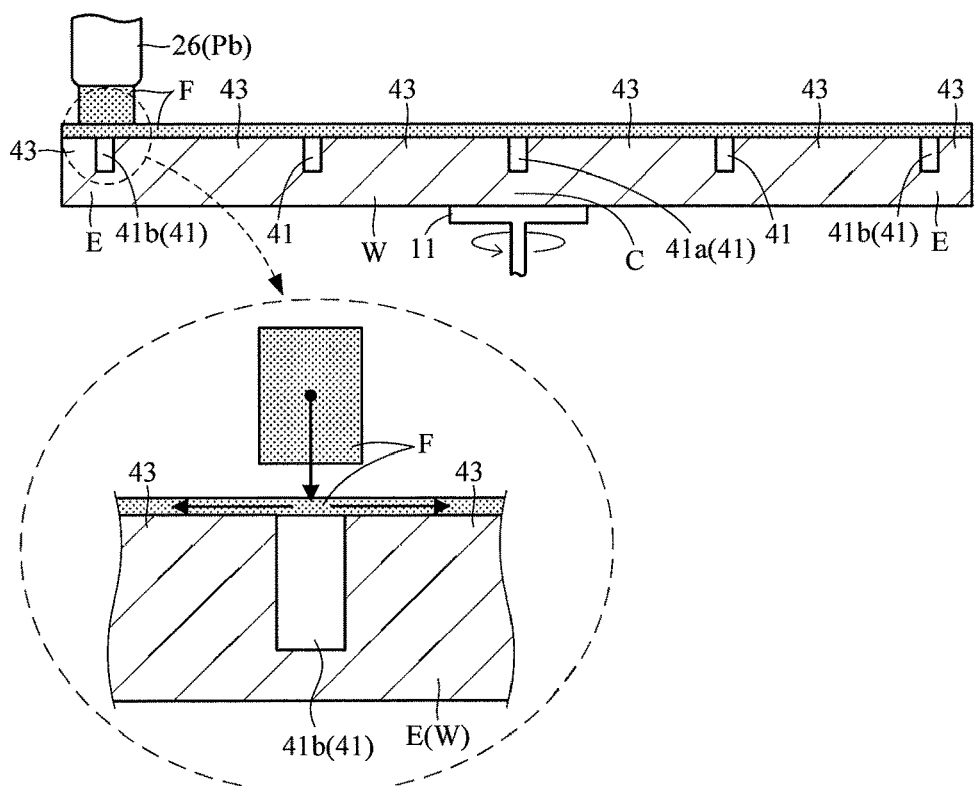

FIGS. 20A and 20B are each a conceptual view of a first step according to Embodiment 2. In the first step, the substrate W rotates at the first rotation speed R1 of relatively high, and the solvent F drops onto the center portion C of the substrate W. Consequently, when dropping down to the center portion C, the solvent F is shifted so strongly in a direction where the substrate W rotates. In other words, energy of downward movement of the solvent F is easily distributed even when the solvent F drops down (contacts)

to the substrate W. This allows suitable suppression in entering of the solvent F into the depressions 41a. See FIG. 20A.

Moreover, in the first step, the substrate W rotates the number of times within a range in plus or minus 20% of the reference value N in a period of time during the movement of the solvent nozzle 26 from the central position Pa to the peripheral position Pb. In the first step, the solvent nozzle 26 moves from the central position Pa to the peripheral position Pb for a period of time within a range in plus or minus 20% of the first reference time T1. Accordingly, the solvent F drops over the top face of the substrate W uniformly. The solvent F does not drop down to a part of the substrate W intensively. The substrate W has no area where the solvent F drops down locally. This allows suitable suppression in entering of the solvent F into the depressions 41 other than the depression 41a. See FIG. 20B.

As noted above, the depressions 41 are tented with the solvent F uniformly in the solvent supplying step.

This results in suitable prevention of the chemical G from entering into any of the depressions 41 in the chemical supplying step. Consequently, the depressions 41 are able to be tented uniformly with the chemical G in the chemical supplying step.

As noted above, the depressions 41 are tented with the solvent F in the coating method of Embodiment 2, achieving suitable tenting of the depressions 41 with the chemical G.

4. Effect of Embodiment 2 The coating method of Embodiment 2 produces the following effects.

The first step causes the substrate W to rotate at a first rotation speed R1, and causes the solvent nozzle 26 to move between the central position Pa and the peripheral position Pb while causing the solvent nozzle 26 to dispense the solvent F. When the solvent nozzle 26 is located at the central position Pa, the solvent nozzle 26 dispenses the solvent F to the center portion C. When the solvent nozzle 26 is located at the peripheral position Pb, the solvent nozzle 26 dispenses the solvent F to the peripheral portion E. As noted above, the solvent F is supplied to both the center portion C and the peripheral portion E in the same manner in the first step. Consequently, the solvent F is able to be supplied to the entire substrate W uniformly in the first step. Accordingly, the chemical supplying step allows the chemical G to spread over the substrate W smoothly. Consequently, the substrate W is able to be coated with the chemical G uniformly in the chemical supplying step. As noted above, the coating method allows appropriate coating of the substrate W with the chemical G The first rotation speed R1 is relatively high, and thus the solvent F is unlikely to enter into the depressions 41. Consequently, the depressions 41 are able to be tented suitably with the solvent F. The depressions 41 are tented with the solvent F, achieving suitable tenting of the depressions 41 with the chemical G When the first rotation speed is equal to or more than 500 rpm, the depressions 41 are able to be tented with the solvent F suitably. Consequently, the depressions 41 are able to be tented more suitably with the chemical G When the first rotation speed R1 is equal to or less than 1,000 rpm, drying of the solvent F is suitable preventable.

The number of rotations of the substrate W in a period of time during the movement of the solvent nozzle 26 between the central position Pa and the peripheral position Pb in the first step is within a range in plus or minus 20% of the reference value N. As a result, the solvent F falls onto the most portion of the substrate W in the first step. Consequently, the solvent F is able to be supplied to the entire substrate W more uniformly in the first step.

A period of time during the movement of the solvent nozzle 26 between the central position Pa and the peripheral position Pb in the first step is within a range in plus or minus 20% of the first reference time T1. As a result, the solvent F falls onto the most portion of the substrate W in the first step. Consequently, the solvent F is able to be supplied to the entire substrate W more uniformly in the first step.

The first step causes the solvent nozzle 26 to dispense the solvent F at the central position Pa before dispensing at the peripheral position Pb. When the solvent nozzle 26 is located at the central position Pa, the solvent nozzle 26 is able to supply the solvent F to the substrate W smoothly. When the solvent nozzle 26 is located at the peripheral position Pb, the solvent nozzle 26 may drop onto a peripheral edge of the substrate W, leading to large scatter of the solvent F. In contrast to this, when the solvent nozzle 26 is located at the central position Pa, the solvent F has no possibility of being scattered largely.

Moreover, in the first step, the solvent nozzle 26 moves from the central position Pa to the peripheral position Pb. Accordingly, the solvent F is able to be supplied continuously from the center portion C to the peripheral portion E of the substrate W smoothly.

In the first step, the solvent nozzle 26 starts to dispense the solvent F from the central position Pa. Consequently, supply of the solvent F is able to start smoothly in the first step.

The solvent F dispensed from the solvent nozzle 26 flows downwardly in a rod shape. Accordingly, the solvent nozzle 26 allows the solvent F to drop down onto the substrate W suitably.

The solvent supplying step includes the film-thinning step. This achieves a suitably thinned film of the solvent F. In the chemical supplying step, the chemical G is supplied to the thin film of the solvent F. As a result, a coating film of the chemical G with a substantially uniform thickness is formable on the substrate W. This results in suitable prevention of variation in thickness of the coating film of the chemical G.

The first step and the film-thinning step are only performed in the solvent supplying step. This achieves reduction in time for the solvent supplying step. Moreover, this also achieves reduction in amount of the solvent F used in the solvent supplying step. The result allows suitable prevention of the solvent F from entering into the depressions 41. That is, the depressions 41 are able to be tented with the solvent F more suitably.

Combination of the first step and the film-thinning step achieves suitable suppression of variation in amount of the solvent F between the center portion C and the peripheral portion E.

Specifically, the first step causes the solvent nozzle 26 to move from the central position Pa to the peripheral position Pb. When the solvent nozzle 26 moves to the peripheral position Pb, the solvent F is not supplied to the center portion C. Accordingly, at the time of completion of the first step, the amount of the chemical G per unit area at the at the center portion C is smaller than the amount of the solvent F per unit area at the peripheral portion E. In contrast to this, the peripheral portion E moves faster than the center portion C in the film-thinning step. Accordingly, reduction in amount of the solvent F at the peripheral portion E is larger than that at center portion C. This results in suitable suppression of variation in amount of the solvent F per unit area between the center portion C and the peripheral portion E at the time of completion of the film-thinning step.

The chemical G has relatively high viscosity. As a result, the chemical G is unlikely to enter into the depressions 41. Consequently, the depressions 41 are able to be tented with the chemical G more suitably in the chemical supplying step.

When the chemical G has viscosity of 200 cP or more, the depressions 41 are able to be tented with the chemical G more suitably in the chemical supplying step. When the chemical G has viscosity of 400 cP or more, the depressions 41 are able to be tented with the chemical G much more suitably in the chemical supplying step.

The substrate W is circular in plan view. As a result, the solvent F is able to be supplied to the entire substrate W uniformly in the solvent supplying step. Likewise, the chemical G is able to be supplied to the entire substrate W uniformly in the chemical supplying step.

The substrate W includes depressions 41. Also, in this case, the solvent F is able to be supplied to the entire substrate W uniformly in the solvent supplying step of the present coating method. As a result, the chemical supplying step allows appropriate coating of the substrate W with the chemical G As noted above, the present coating method possesses high utility especially when the substrate W includes the depressions 41.

The present invention is not limited to the foregoing examples, but may be modified as follows.

(1) In Embodiments 1 and 2 mentioned above, the solvent nozzle 26 includes one outlet 26a. However, this is not limitative. For instance, the solvent nozzle 26 may include a plurality of outlets 26a.

(2) In Embodiments 1 and 2 mentioned above, the outlet 26a of the solvent nozzle 26 is substantially circular. However, this is not limitative. For instance, the outlets 26a may be oval or polygonal. For instance, the outlet 26a may be elongated. For instance, the solvent nozzle 26 may be a slit nozzle.

(3) In Embodiments 1 and 2, the solvent nozzle 26 is moved from the central position Pa to the peripheral position Pb in the first step. However, this is not limitative. The solvent nozzle 26 may be moved from the peripheral position Pb to the central position Pa in the first step.

(4) In Embodiment 1, the solvent nozzle 26 is moved from the peripheral position Pb to the central position Pa in the second step. However, this is not limitative. The solvent nozzle 26 may be moved from the central position Pa to the peripheral position Pb in the second step.

(5) In Embodiment 1 mentioned above, the direction of the solvent nozzle 26 moved between the central position Pa and the peripheral position Pb in the first step is opposite to that in the second step. However, this is not limitative. The direction of the solvent nozzle 26 moved between the central position Pa and the peripheral position Pb in the first step may be the same direction as that in the second step.

(6) In Embodiment 2 mentioned above, the period of time when the solvent nozzle 26 moves from the central position Pa to the peripheral position Pb in the first step is within a range in plus or minus 20% of the first reference time T1. However, this is not limitative. The period of time when the solvent nozzle 26 moves between the central position Pa and the peripheral position Pb in the first step may be within a range in plus or minus 1 sec. from the first reference time T1. In other words, the solvent nozzle 26 may move between the central position Pa and the peripheral position Pb in the first step for a period of time within a range in plus or minus 1 sec. from the first reference time T1.

(7) In Embodiments 1 and 2 mentioned above, the route L1 where the solvent nozzle 26 moves between the central position Pa and the peripheral position Pb is a curve close to the radial direction of the substrate W in plan view. However, this is not limitative. For instance, the solvent nozzle 26 may move in the radial direction of the substrate W in plan view. For instance, the solvent nozzle 26 may move between the central position Pa and the peripheral position Pb linearly in plan view. In this modification, the configuration of the moving mechanism 27 is variable appropriately. For instance, the configuration of the moving mechanism 27 may be similar to that of the moving mechanism 37.

(8) In Embodiments 1 and 2 mentioned above, the moving speed of the solvent nozzle 26 is constant in the first step. However, this is not limitative. The moving speed of the solvent nozzle 26 is variable in the first step.

(9) In Embodiment 1 mentioned above, the moving speed of the solvent nozzle 26 is constant in the second step. However, this is not limitative. The moving speed of the solvent nozzle 26 is variable in the second step.

(10) In Embodiments 1 and 2 mentioned above, the solvent nozzle 26 is movable in the vertical direction. For instance, the solvent nozzle 26 may be movable in the horizontal direction and the vertical direction in the solvent supplying step. With this modification, the solvent nozzle 26 is able to dispense the solvent F to the substrate W while changing its level. With this modification, the solvent nozzle 26 is able to dispense the solvent F to the substrate W while a gap between the substrate W and the solvent nozzle 26 varies.

(11) In Embodiment 1 mentioned above, the depressions 41 are filled with the solvent F in the solvent supplying step. However, this is not limitative. That is, the depressions 41 are not necessarily filled with the solvent F in the solvent supplying step. For instance, at least either inner walls or the bottoms of the depressions 41 may be coated with the solvent F in the solvent supplying step. This also allows the chemical G to enter into the depressions 41 smoothly.

(12) In Embodiment 2 mentioned above, the solvent F does not enter into the depressions 41 in the solvent supplying step. However, this is not limitative. The solvent F may enter into the depressions 41 to some degree as long as the depressions 41 are tented with the solvent F in the solvent supplying step.

(13) In Embodiment 1 mentioned above, the solvent supplying step includes the puddle-forming step. However, this is not limitative. That is, the solvent supplying step does not necessarily include the puddle-forming step.

(14) In Embodiment 1 mentioned above, the solvent supplying step includes the second step. However, this is not limitative. That is, the solvent supplying step does not necessarily include the second step.

(15) In Embodiments 1 and 2 mentioned above, the solvent supplying step includes the film-thinning step. However, this is not limitative. That is, the solvent supplying step does not necessarily include the film-thinning step.

(16) In Embodiment 2 mentioned above, the rotation speed of the substrate W in the film-thinning step is higher than the first rotation speed R1. However, this is not limitative. For instance, the rotation speed of the substrate W in the film-thinning step may be equal to the first rotation speed R1. For instance, the rotation speed of the substrate W in the film-thinning step may be lower than the first rotation speed R1.

(17) In Embodiment 1 mentioned above, the puddle-forming step is performed before the second step and after the first step. However, this is not limitative. For instance, the puddle-forming step is performable after the second step. For instance, the second step is performable successively after the first step.

(18) The chemical supplying step In Embodiment 1 may be replaced by the chemical supplying step in Embodiment 2. Specifically, the chemical supplying step In Embodiment 2 is performable after the solvent supplying step in Embodiment 1. Such a modification achieves the same effect as that of Embodiment 1.

(19) The chemical supplying step in Embodiment 2 may be replaced by the chemical supplying step in Embodiment 1. Specifically, the chemical supplying step in Embodiment 1 is performable after the solvent supplying step in Embodiment 2. Such a modification achieves the same effect as that of Embodiment 2.

(20) The chemical nozzle 36 in Embodiment 1 may have the same configuration as that in Embodiment 2. For instance, the chemical nozzle 36 in Embodiment 1 may have the outlet 36a in Embodiment 2. Alternatively, the chemical nozzle 36 in Embodiment 1 may have the different configuration from that in Embodiment 2. For instance, the chemical nozzle 36 in Embodiment 1 may have a substantially circular outlet.

(21) In Embodiments 1 and 2 mentioned above, the chemical nozzle 36 may be movable in the horizontal direction and the vertical direction. For instance, the chemical nozzle 36 may be movable in the vertical direction in the chemical supplying step. With this modification, the chemical nozzle 36 is able to dispense the chemical G to the substrate W while changing its level. With this modification, the chemical nozzle 36 is able to dispense the chemical G to the substrate W while a gap between the substrate W and the chemical nozzle 36 varies.

(22) In Embodiments 1 and 2 mentioned above, the substrate W includes depressions 41. However, this is not limitative. That is, the substrate W does not necessarily include any depressions 41. For instance, the top face of the substrate W may be planar.

(23) Embodiments 1 and 2 mentioned above as well as the modifications in the above (1) to (22) may be variable appropriately by replacing or combining the elements of the present embodiments or the modifications with the other thereof.

The present invention may be embodied in other specific forms without departing from the spirit or essential attributes thereof and, accordingly, reference should be made to the appended claims, rather than to the foregoing specification, as indicating the scope of the invention.

REFERENCE SIGNS LIST

1 . . . substrate treating apparatus
11 . . . spin holder
26 . . . solvent nozzle
26a . . . outlet
27 . . . moving mechanism
36 . . . chemical nozzle
36a . . . outlet
37 . . . moving mechanism
39 . . . controller
41, 41a, 41b . . . depression
43 . . . projection
B . . . drop area
C . . . center portion
D . . . dimension of outlet 26a
E . . . peripheral portion
F . . . solvent
G, G1, G2, G3 . . . chemical
Pa . . . central position
Pb . . . peripheral position
r . . . radius of substrate W
R1 . . . first rotation speed
R2 . . . second rotation speed
N . . . reference value
T1 first reference time
T2 . . . second reference time
W . . . substrate

What is claimed is:

1. A coating method of coating a substrate with a chemical, the coating method comprising:
a solvent supplying step of supplying a solvent to the substrate; and a chemical supplying step of supplying the chemical to the substrate after the solvent supplying step, wherein the solvent supplying step includes a first step of rotating the substrate at a first rotation speed, moving a solvent nozzle between a central position above a center portion of the substrate and a peripheral position above a peripheral portion of the substrate, and dispensing the solvent from the solvent nozzle: and the solvent is an organic solvent, wherein the first rotation speed is more than 0 rpm and less than 500 rpm, the solvent nozzle includes an outlet through which the solvent is dispensed, and comprising:
obtaining a reference value by dividing a radius of the substrate by a dimension of the outlet; and in the first step, while moving the solvent nozzle between the central position and the peripheral position, rotating the substrate by a number of rotations that is equal to or more than the reference value.

2. The coating method according to claim 1, wherein
the first rotation speed is more than 0 rpm and less than 500 rpm,
the solvent nozzle includes an outlet through which the solvent is dispensed, and
a number of rotations of the substrate for a period of time when the solvent nozzle moves between the central position and the peripheral position in the first step is equal to or more than a reference value obtained by dividing a radius of the substrate by a dimension of the outlet.

3. The coating method according to claim 2, wherein
the period of time when the solvent nozzle moves between the central position and the peripheral position in the first step is equal to or longer than a first reference time obtained by dividing the reference value by the first rotation speed.

4. The coating method according to claim 2, wherein
the solvent supplying step includes a puddle-forming step of keeping a puddle of the solvent on the substrate.

5. The coating method according to claim 2, wherein
the solvent supplying step includes a second step of rotating the substrate at a second rotation speed, moving the solvent nozzle between the central position and the peripheral position, and dispensing the solvent from the solvent nozzle.

6. The coating method according to claim 5, wherein
the second rotation speed is more than 0 rpm and less than 500 rpm.

7. The coating method according to claim 2, wherein
the solvent supplying step includes a film-thinning step of thinning a film of the solvent formed on the substrate by rotating the substrate.

8. The coating method according to claim 1, wherein
the first rotation speed is more than 500 rpm.

9. The coating method according to claim 8, wherein
the solvent nozzle includes an outlet thorough which the solvent is dispensed, and a number of rotations of the substrate for a period of time when the solvent nozzle moves between the central position and the peripheral position in the first step is within a range in plus or minus 20% of a reference value obtained by dividing a radius of the substrate by a dimension of the outlet.

10. The coating method according to claim 9, wherein the period of time when the solvent nozzle moves between the central position and the peripheral position in the first step is within a range in plus or minus 20% of a first reference time obtained by dividing the reference value by the first rotation speed.

11. The coating method according to claim 8, wherein the solvent supplying step includes a film-thinning step of thinning a film of the solvent formed on the substrate by rotating the substrate.

12. The coating method according to claim 11, wherein the solvent supplying step performs only the first step and the film-thinning step.

13. The coating method according to claim 8, wherein the chemical supplied to the substrate in the chemical supplying step has viscosity of 200 cP or more.

14. The coating method according to claim 1, wherein the solvent nozzle moves from the central position to the peripheral position in the first step.

15. The coating method according to claim 1, wherein the solvent dispensed from the solvent nozzle flows down in a rod shape.

16. The coating method according to claim 1, wherein the substrate is circular in plan view.

17. The coating method according to claim 1, wherein the substrate has depressions formed on a top face thereof.

\* \* \* \* \*